(12) United States Patent
Knapp et al.

(10) Patent No.: US 9,341,949 B2
(45) Date of Patent: May 17, 2016

(54) PHOTOSENSITIVE COMPOSITIONS AND APPLICATIONS THEREOF

(71) Applicants: PROMERUS, LLC, Brecksville, OH (US); SUMITOMO BAKELITE CO., LTD, Shinagawa-Ku, Tokyo (JP)

(72) Inventors: Brian Knapp, Brecksville, OH (US); Cheryl Burns, Brecksville, OH (US); Edmund Elce, Brecksville, OH (US); Keitaro Seto, Brecksville, OH (US); Hiromichi Sugiyama, Tokyo (JP); Makoto Horii, Tokyo (JP); Kazuyoshi Fujita, Tokyo (JP)

(73) Assignees: PROMERUS, LLC, Brecksville, OH (US); SUMITOMO BAKELITE CO., LTD., Tokyo (JP)

( * ) Notice: Subject to any disclaimer, the term of this patent is extended or adjusted under 35 U.S.C. 154(b) by 0 days.

(21) Appl. No.: 14/261,922

(22) Filed: Apr. 25, 2014

(65) Prior Publication Data

US 2014/0322647 A1    Oct. 30, 2014

Related U.S. Application Data

(60) Provisional application No. 61/840,018, filed on Jun. 27, 2013, provisional application No. 61/847,273, filed on Jul. 17, 2013.

(30) Foreign Application Priority Data

Apr. 26, 2013 (JP) ................................ 2013-094737

(51) Int. Cl.
| | |
|---|---|
| *G03F 7/022* | (2006.01) |
| *G03F 7/20* | (2006.01) |
| *G03F 7/075* | (2006.01) |
| *G03F 7/004* | (2006.01) |
| *G03F 7/023* | (2006.01) |

(52) U.S. Cl.
CPC ............ *G03F 7/0757* (2013.01); *G03F 7/0045* (2013.01); *G03F 7/0046* (2013.01); *G03F 7/0226* (2013.01); *G03F 7/0233* (2013.01); *G03F 7/0751* (2013.01); *G03F 7/20* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/92247* (2013.01); *H01L 2225/06562* (2013.01); *H01L 2924/15311* (2013.01)

(58) Field of Classification Search
None
See application file for complete search history.

(56) References Cited

U.S. PATENT DOCUMENTS

| 2006/0008734 A1 | 1/2006 | Amoroso et al. |
| 2012/0129101 A1 | 5/2012 | Onishi et al. |
| 2013/0181199 A1* | 7/2013 | Apanius et al. ................. 257/40 |

FOREIGN PATENT DOCUMENTS

| EP | 1164434 A2 | 12/2001 |
| EP | 1413927 A1 | 4/2004 |
| EP | 2302456 A1 | 3/2011 |
| WO | WO2013/109529 A1 | 7/2013 |

OTHER PUBLICATIONS

CAS Registry No. 1843-03-4.obtained Apr. 26, 2015, from SciFinder database , copyright American Chemical Society, 2 pages.*
International Search Report mailed Aug. 26, 2014 for PCT/US2014/035439 filed Apr. 25, 2014.
Written Opinion of the International Searching Authority mailed Aug. 26, 2014 for PCT/US2014/035439 filed Apr. 25, 2014.

* cited by examiner

*Primary Examiner* — Cynthia Hamilton
(74) *Attorney, Agent, or Firm* — Balaram Gupta

(57) ABSTRACT

The present invention relates to photosensitive compositions containing polynorbornene (PNB) polymers and certain additives that are useful for forming microelectronic and/or optoelectronic devices and assemblies thereof, and more specifically to compositions encompassing PNBs and certain hindered phenols as additives which are resistant to thermo-oxidative chain degradation.

30 Claims, 2 Drawing Sheets

PHOTOSENSITIVE COMPOSITIONS AND APPLICATIONS THEREOF

CROSS REFERENCE TO RELATED APPLICATIONS

This application claims the benefit of U.S. Provisional Application No. 61/840,018, filed Jun. 27, 2013 and U.S. Provisional Application No. 61/847,273, filed Jul. 17, 2013; and benefit of priority of Japanese Patent Application No. JP2013-094737, filed Apr. 26, 2013; all of which are incorporated herein by reference in their entirety.

TECHNICAL FIELD

Embodiments in accordance with the present invention relate generally to polynorbornene (PNB) compositions, which contain a wide variety of additives that are useful for forming microelectronic and/or optoelectronic devices and assemblies thereof, and more specifically to compositions encompassing PNBs having norbornene-type repeating units that are polyether functionalized and contain certain additives where such compositions exhibit improved thermal and optoelectronic properties.

BACKGROUND

Organic polymer materials are increasingly being used in the microelectronics and optoelectronics industries for a variety of applications. For example, the uses for such organic polymer materials include interlevel dielectrics, redistribution layers, stress buffer layers, leveling or planarization layers, alpha-particle barriers, and passivation layers for microelectronic and optoelectronic devices. Where such organic polymer materials are photosensitive, thus self-imageable, and therefore, offer additional advantage of reducing the number of processing steps required for the use of such layers and structures made therefrom. Additionally, such organic polymer materials enable the direct adhesive bonding of devices and device components to form various structures. Such devices include microelectromechanical systems (MEMS) and microoptoelectromechanical systems (MOEMS).

While polyimide (PI), polybenzoxazole (PBO) and benzocyclobutane (BCB) compositions have been materials of choice for many of the aforementioned applications due to their generally good thermal stability and mechanical strength, each of the above materials are either formed during curing from precursors that react to modify the polymer's backbone (PI and PBO) or to form such backbone (BCB) and thus generally require special handling conditions during curing to remove by-products that are formed during such curing and/or to exclude oxygen or water vapor that can prevent such curing. Additionally, the curing of such materials often requires process temperatures in excess of 250° C. (and as high as 400° C. for some materials), resulting in excessive and undesirable process costs. Therefore such materials can be problematic for some applications, e.g., redistribution and interlevel dielectric layers as well as direct adhesive bonding of a transparent cover over image sensing arrays.

Therefore it is believed that it would be advantageous to provide a material, useful for forming the aforementioned structures, that exhibits thermal stability and mechanical strength equivalent to the known PI, PBO, and BCB compositions, where such a material has a fully formed polymer backbone that allows for curing at temperatures of 200° C. or lower. Further, such an advantageous material should be tailorable in its characteristics to provide appropriate levels or values of stress, modulus, dielectric constant, elongation to break and permeability to water vapor for the application for which it is intended. Still further, it would be advantageous for such a material to be self-imageable. In addition, several of the presently available compositions may not be suitable in certain of the applications as they do not exhibit the required dissolution rate (DR) properties, including desirable resolution and photospeed, as further described in detail below.

Accordingly, there is still a need to develop self imageable photosensitive polymer compositions which feature desirable thermal properties, dissolution rate, orthogonality to various solvents used in different steps of the device fabrication processes, bond adhesion, and most importantly integration into all involved process steps.

BRIEF DESCRIPTION OF THE DRAWINGS

Embodiments in accordance with the present invention are described below with reference to the following accompanying figures and/or images. Where drawings are provided, it will be drawings which are simplified portions of various embodiments of this invention and are provided for illustrative purposes only.

FIG. 1A is a photolithographic image obtained from a composition without any additive using a Stepper by image-wise exposure at a radiation dose of 325 mJ; FIG. 1B is a photolithographic image obtained from a composition without any additive using an Aligner by image-wise exposure at a radiation dose of 325 mJ; FIG. 1C is a photolithographic image obtained from a composition of this invention containing a 10 pphr of 2,2'-methylenediphenol as the additive using a Stepper by image-wise exposure at a radiation dose of 225 mJ; and FIG. 1D is a photolithographic image obtained from a composition of this invention containing a 10 pphr of 2,2'-methylenediphenol as the additive using an Aligner by image-wise exposure at a radiation dose of 225 mJ.

DETAILED DESCRIPTION

Figure 1:
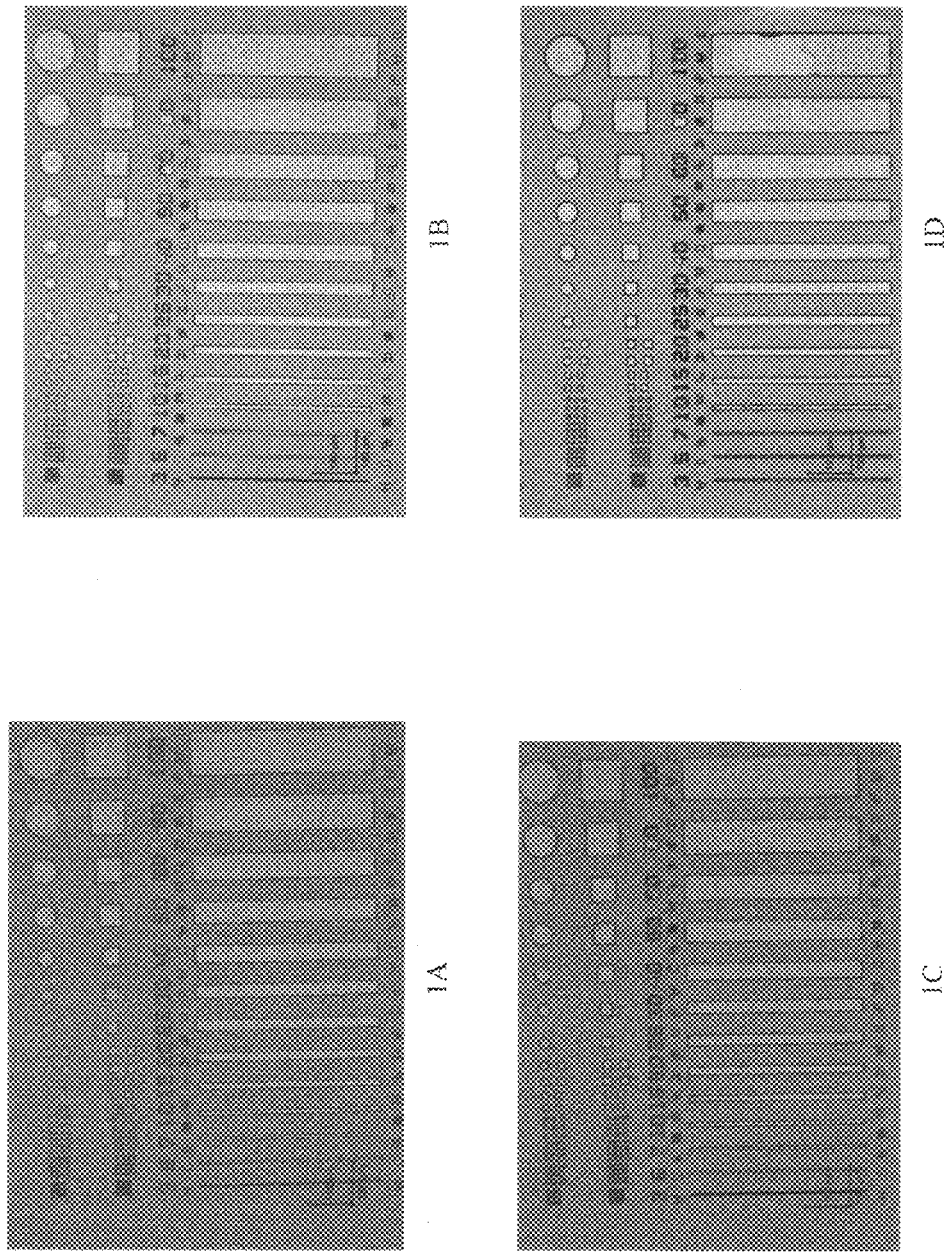
FIG. 1 shows comparative photolithographic images formed from a composition of this invention.

Embodiments in accordance with the present invention are directed to self-imageable compositions that encompass norbornene-type polymers and the films, layers, structures, devices or assemblies that can be formed using such compositions. Some of such embodiments encompass self-imageable compositions which can provide positive-tone images, after image-wise exposure of a film formed thereof, followed by development of such images, using an aqueous base developer solution. While other of such embodiments encompass self-imageable compositions which can provide negative-tone images, after image-wise exposure of a film formed thereof, followed by development of such images, using an appropriate aqueous or solvent based developer.

Further, the embodiments as described fully herein can routinely provide films of 5 microns (μm) thickness or greater and images demonstrating aspect ratios in excess of 1:2 for isolated line/trench resolution in such films. The films, layers, and structures formed from the polymer embodiments of the present invention being useful for, among other things, interlevel dielectrics, redistribution layers, stress buffer layers, leveling or planarization layers, alpha-particle barriers for both microelectronic and optoelectronic devices and the assemblies formed thereof, as well as adhesive bonding to form chip-stacks and to fixably attach transparent covers over image sensing arrays.

The terms as used herein have the following meanings:

Unless otherwise indicated, all numbers, values and/or expressions referring to quantities of ingredients, reaction conditions, polymer compositions, and formulations used herein are to be understood as modified in all instances by the term "about" as such numbers are inherently approximations that are reflective of, among other things, the various uncertainties of measurement encountered in obtaining such values. Further, where a numerical range is disclosed herein, such range is continuous, and includes unless otherwise indicated, every value from the minimum value to and including the maximum value of such range. Still further, where such a range refers to integers, unless otherwise indicated, every integer from the minimum value to and including the maximum value is included. In addition, where multiple ranges are provided to describe a feature or characteristic, such ranges can be combined to further describe such a feature or characteristic.

As used herein, the articles "a," "an," and "the" include plural referents unless otherwise expressly and unequivocally limited to one referent.

It will be understood that, as used herein, the phrase "microelectronic device" is inclusive of a "micro-optoelectronic device" and an "optoelectronic device". Thus, reference to microelectronic devices or a microelectronic device assemblies are inclusive of optoelectronic devices and micro-optoelectronic devices as well as assemblies thereof. Similarly, microelectromechanical systems (MEMS) include microoptoelectro-mechanical systems (MOEMS).

It will be understood that the term "redistribution layer (RDL)" refers to an electrical signal routing insulation material which features desirable and reliable properties. The term RDL may also be used interchangeably to describe buffer coating layers, such as for example, a stress relief or buffer layer between the solder ball and fragile low-K structure.

As used herein, the term "polymer" will be understood to mean a molecule that encompasses a backbone of one or more distinct types of repeating units (the smallest constitutional unit of the polymer) and is inclusive of, in addition to the polymer itself, residues from initiators, catalysts, and other elements attendant to the forming of such a polymer, where such residues are generally understood as not being covalently incorporated thereto, but maybe covalently bound to the front or back end of the polymeric chain as in certain catalyst initiated polymerization. Further, such residues and other elements, while normally removed during post polymerization purification processes, are typically mixed or co-mingled with the polymer such that some small amount generally remains with the polymer when it is transferred between vessels or between solvents or dispersion media.

As used herein, the term "polymer composition" is meant to include at least one synthesized polymer, as well as materials added after the forming of the polymer(s) to provide or modify specific properties of such composition. Exemplary materials that can be added include, but are not limited to, solvents, photoactive compounds (PAC), dissolution rate inhibitors, dissolution rate enhancers, dissolution promoters, crosslinking moieties, reactive diluents, antioxidants, adhesion promoters, and plasticizers.

As used herein, the term "modulus" is understood to mean the ratio of stress to strain and unless otherwise indicated, refers to the Young's Modulus or Tensile Modulus measured in the linear elastic region of the stress-strain curve. Modulus values are generally measured in accordance with ASTM method D1708-95. Films having a low modulus are understood to also have low internal stress.

The term "photodefinable" refers to the characteristic of a material or composition of materials, such as a polymer or polymer composition in accordance with embodiments of the present invention, to be formed into, in and of itself, a patterned layer or a structure. In alternate language, a "photodefinable layer" does not require the use of another material layer formed thereover, for example, a photoresist layer, to form the aforementioned patterned layer or structure. It will be further understood that a polymer composition having such a characteristic is generally employed in a pattern forming scheme to form a patterned film/layer or structure. It will be noted that such a scheme incorporates an "imagewise exposure" of the photodefinable material or layer formed therefrom. Such imagewise exposure being taken to mean an exposure to actinic radiation of selected portions of the layer, where non-selected portions are protected from such exposure to actinic radiation.

As used herein, the term "self-imageable compositions" will be understood to mean a material that is photodefinable and can thus provide patterned layers and/or structures after direct image-wise exposure of a film formed thereof followed by development of such images in the film using an appropriate developer.

As used herein, "hydrocarbyl" refers to a radical or a group that contains only carbon and hydrogen atoms, non-limiting examples being alkyl, cycloalkyl, aryl, aralkyl, alkaryl, and alkenyl. The term "halohydrocarbyl" refers to a hydrocarbyl group where at least one hydrogen atom has been replaced by a halogen atom. The term perhalocarbyl refers to a hydrocarbyl group where all hydrogens have been replaced by halogens. The term "heterohydrocarbyl" refers to any of the previously described hydrocarbyls, halohydrocarbyls, and perhalohydrocarbyls where at least one carbon atom of the carbon chain is replaced with a N, O, S, Si or P atom.

As used herein, the symbol "〰" denotes a position at which the bonding takes place with another repeat unit or another atom or molecule or group or moiety as appropriate with the structure of the group as shown.

As used herein, the expression "$C_1$-$C_6$alkyl" includes methyl and ethyl groups, and straight-chained or branched propyl, butyl, pentyl and hexyl groups. Particular alkyl groups are methyl, ethyl, n-propyl, isopropyl and tert-butyl. Derived expressions such as "$C_1$-$C_4$alkoxy", "$C_1$-$C_4$thioalkyl" "$C_1$-$C_4$alkoxyC_1$-$C_4$alkyl", "hydroxyC$_1$-$C_4$alkyl", "$C_1$-$C_4$alkylcarbonyl", "$C_1$-$C_4$alkoxycarbonylC$_1$-$C_4$alkyl", "$C_1$-$C_4$alkoxycarbonyl", "aminoC$_1$-$C_4$alkyl", "$C_1$-$C_4$alkylamino", "$C_1$-$C_4$alkylcarbamoylC$_1$-$C_4$alkyl", "$C_1$-$C_4$dialkylcarbamoylC$_1$-$C_4$alkyl" "mono- or di-$C_1$-$C_4$alkylaminoC$_1$-$C_4$alkyl", "aminoC$_1$-$C_4$alkylcarbonyl" "diphenylC$_1$-$C_4$alkyl", "phenylC$_1$-$C_4$alkyl", "phenylcarboylC$_1$-$C_4$alkyl" and "phenoxyC$_1$-$C_4$alkyl" are to be construed accordingly.

As used herein, the expression "cycloalkyl" includes all of the known cyclic aliphatic radicals. Representative examples of "cycloalkyl" includes without any limitation cyclopropyl, cyclobutyl, cyclopentyl, cyclohexyl, cycloheptyl, cyclooctyl and the like. Derived expressions such as "cycloalkoxy", "cycloalkylalkyl", "cycloalkylaryl", "cycloalkylcarbonyl" are to be construed accordingly.

As used herein, the expression "$C_2$-$C_6$alkenyl" includes ethenyl and straight-chained or branched propenyl, butenyl, pentenyl and hexenyl groups. Similarly, the expression "$C_2$-$C_6$alkynyl" includes ethynyl and propynyl, and straight-chained or branched butynyl, pentynyl and hexynyl groups.

As used herein the expression "$C_1$-$C_4$acyl" shall have the same meaning as "$C_1$-$C_4$alkanoyl", which can also be represented structurally as "R—CO—," where R is a $C_1$-$C_3$alkyl as defined herein. Additionally, "$C_1$-$C_3$alkylcarbonyl" shall mean same as $C_1$-$C_4$acyl. Specifically, "$C_1$-$C_4$acyl" shall mean formyl, acetyl or ethanoyl, propanoyl, n-butanoyl, etc. Derived expressions such as "$C_1$-$C_4$acyloxy" and "$C_1$-$C_4$acyloxyalkyl" are to be construed accordingly.

As used herein, the expression "$C_1$-$C_6$perfluoroalkyl" means that all of the hydrogen atoms in said alkyl group are replaced with fluorine atoms. Illustrative examples include trifluoromethyl and pentafluoroethyl, and straight-chained or branched heptafluoropropyl, nonafluorobutyl, undecafluoropentyl and tridecafluorohexyl groups. Derived expression, "$C_1$-$C_6$perfluoroalkoxy", is to be construed accordingly.

As used herein, the expression "$C_6$-$C_{20}$aryl" means substituted or unsubstituted phenyl or naphthyl. Specific examples of substituted phenyl or naphthyl include o-, p-, m-tolyl, 1,2-, 1,3-, 1,4-xylyl, 1-methylnaphthyl, 2-methylnaphthyl, etc. "Substituted phenyl" or "substituted naphthyl" also include any of the possible substituents as further defined herein or one known in the art. Derived expression, "$C_6$-$C_{10}$arylsulfonyl," is to be construed accordingly.

The expressions "arylalkyl" or "aralkyl" are used interchangeably herein, and specifically "$C_6$-$C_{10}$aryl$C_1$-$C_4$alkyl" or "$C_7$-$C_{14}$aralkyl" means that the $C_6$-$C_{10}$aryl as defined herein is further attached to $C_1$-$C_4$alkyl as defined herein. Representative examples include benzyl, phenylethyl, 2-phenylpropyl, 1-naphthylmethyl, 2-naphthylmethyl, and the like.

As used herein, the expression "heteroaryl" includes all of the known heteroatom containing aromatic radicals. Representative 5-membered heteroaryl radicals include furanyl, thienyl or thiophenyl, pyrrolyl, isopyrrolyl, pyrazolyl, imidazolyl, oxazolyl, thiazolyl, isothiazolyl, and the like. Representative 6-membered heteroaryl radicals include pyridinyl, pyridazinyl, pyrimidinyl, pyrazinyl, triazinyl, and the like radicals. Representative examples of bicyclic heteroaryl radicals include, benzofuranyl, benzothiophenyl, indolyl, quinolinyl, isoquinolinyl, cinnolyl, benzimidazolyl, indazolyl, pyridofuranyl, pyridothienyl, and the like radicals.

As used herein, the expression "heterocycle" includes all of the known reduced heteroatom containing cyclic radicals. Representative 5-membered heterocycle radicals include tetrahydrofuranyl, tetrahydrothiophenyl, pyrrolidinyl, 2-thiazolinyl, tetrahydrothiazolyl, tetrahydrooxazolyl, and the like. Representative 6-membered heterocycle radicals include piperidinyl, piperazinyl, morpholinyl, thiomorpholinyl, and the like. Various other heterocycle radicals include, without limitation, aziridinyl, azepanyl, diazepanyl, diazabicyclo[2.2.1]hept-2-yl, and triazocanyl, and the like.

"Halogen" or "halo" means chloro, fluoro, bromo, and iodo.

In a broad sense, the term "substituted" is contemplated to include all permissible substituents of organic compounds. In a few of the specific embodiments as disclosed herein, the term "substituted" means substituted with one or more substituents independently selected from the group consisting of $C_1$-$C_6$alkyl, $C_2$-$C_6$alkenyl, $C_1$-$C_6$perfluoroalkyl, phenyl, hydroxy, —$CO_2$H, an ester, an amide, $C_1$-$C_6$alkoxy, $C_1$-$C_6$thioalkyl, $C_1$-$C_6$perfluoroalkoxy, —$NH_2$, Cl, Br, I, F, —NH-lower alkyl, and —N(lower alkyl)$_2$. However, any of the other suitable substituents known to one skilled in the art can also be used in these embodiments.

As used herein, the term Organic Field Effect Transistors (OFET) will be understood to be inclusive of the subclass of such devices known as Organic Thin Film Transistors (OTFTs).

It will be understood that the terms "dielectric" and "insulating" are used interchangeably herein. Thus reference to an insulating material or layer is inclusive of a dielectric material or layer and vice versa. Further, as used herein, the term "organic electronic device" will be understood to be inclusive of the term "organic semiconductor device" and the several specific implementations of such devices such as the organic field effect transistors (OFETs).

As used herein, the terms "orthogonal" and "orthogonality" will be understood to mean chemical orthogonality. For example, an orthogonal solvent means a solvent which, when used in the deposition of a layer of a material dissolved therein on a previously deposited layer, does not dissolve or swell said previously deposited layer.

As used herein, the terms "polycycloolefin", "poly(cyclic) olefin", and "polynorbornene-type" are interchangeably used to refer to polymers formed from addition polymerizable monomers, the repeating units in the resulting polymers or the compositions that encompass such polymers, where repeating units of such resulting polymers encompass at least one norbornene-type moiety. The simplest norbornene-type polymerizable monomer encompassed by embodiments in accordance with the present invention is norbornene itself, bicyclo[2.2.1]hept-2-ene, as shown below:

However, the term norbornene-type monomer, norbornene-type repeating unit or norbornene-type polymer (PNB) as used herein is not limited to such moieties that encompass only norbornene itself, but rather to any substituted norbornene(s), or substituted and unsubstituted higher cyclic derivatives thereof.

Published US Patent Application No. US 2011-0070543 A1 (the '543 publication) discloses a negative tone, aqueous-base developable PNB composition that encompasses a norbornenyl-2-trifluoromethyl-3,3,3-trifluoropropan-2-ol (HFANB)/norbornenylpropanoic acid (NBEtCOOH) polymer having a molar ratio of 75/25, with a photo acid generator compound (PAG), a photo sensitizer, adhesion promoters, and crosslinker additives, e.g., Example 12-8. Further, such '543 publication discloses, in Examples 12-1, 12-2 and 12-3, positive tone compositions that encompass the aforementioned polymer and appropriate additives. This reference to the above Examples of the '543 publication is provided to establish the current state of the art to which this disclosure is directed. The state of the art demonstrated therein only provided a negative tone composition having acceptable self-imaging capability since the positive tone compositions that were provided did not exhibit acceptable self-imaging capability.

It has now been found that certain of the additives when used in conjunction with the composition of this invention remarkably improves the performance of the compositions in forming a thick film, which can be used as a thick film separator having utility in a variety of applications including but not limited to mechanical, electrical, or electromechanical devices, including chip-stacking applications, as a redistribution layer (RDL) and in dam structures of a CMOS image sensor and various other MEMS and MOEMS containing devices.

Thus, in accordance with the practice of this invention there is provided a photosensitive composition comprising:

a) a polymer having a first type of repeating unit of formula (IA) derived from a monomer of formula (I):

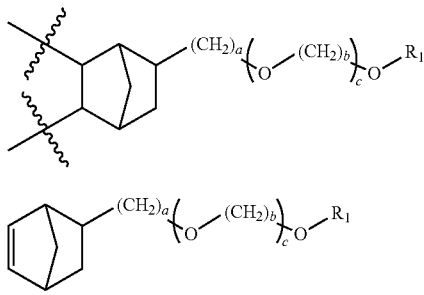

wherein:
- ⁓ represents a position at which the bonding takes place with another repeat unit;
- a is an integer from 0 to 3;
- b is an integer from 1 to 4;
- c is an integer from 1 to 4;
- $R_1$ is selected from hydrogen, methyl, ethyl, n-propyl, i-propyl or n-butyl;

b) a photo active compound containing a diazo-quinone moiety of formula (A):

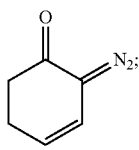

c) an epoxy compound containing one or more oxirane rings; and
d) an additive selected from:
a compound of formula (IV):

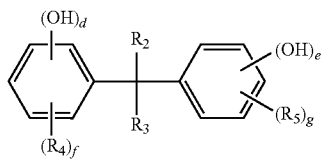

wherein d and e are integers from 1 to 4;
f and g are integers from 0 to 4;
$R_2$ and $R_3$ are the same or different and independently of each other selected from hydrogen, methyl, ethyl, linear or branched $C_3$-$C_6$alkyl, $C_3$-$C_6$cycloalkyl, $C_6$-$C_{10}$aryl and $C_7$-$C_{12}$aralkyl; or
$R_2$ and $R_3$ taken together with the carbon atom to which they are attached form a 5 to 8 membered substituted or unsubstituted carbocyclic ring where said substituents are selected from $C_1$-$C_8$alkyl;
$R_4$ and $R_5$ are the same or different and independently of each other selected from hydrogen, methyl, ethyl, linear or branched $C_3$-$C_6$alkyl, $C_3$-$C_8$cycloalkyl, $C_6$-$C_{10}$aryl and $C_7$-$C_{12}$aralkyl;

a compound of formula (V):

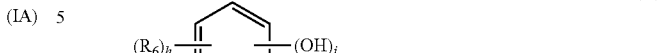

wherein h is an integer from 0 to 4;
i is 1 or 2;
$R_6$ independently is hydrogen, methyl, ethyl, linear or branched $C_3$-$C_{16}$alkyl, $C_3$-$C_8$cycloalkyl, $C_6$-$C_{10}$aryl, $C_7$-$C_{12}$aralkyl or —$CO_2H$;
a compound of formula (VI):

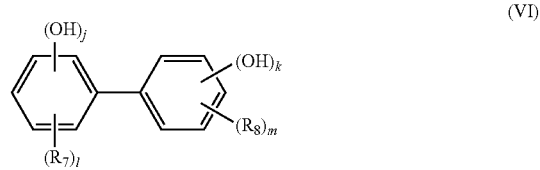

wherein j and k are integers from 1 to 4;
l and m are integers from 0 to 4;
$R_7$ and $R_8$ are the same or different and independently of each other selected from hydrogen, methyl, ethyl, linear or branched $C_3$-$C_4$alkyl, $C_3$-$C_8$cycloalkyl, $C_6$-$C_{10}$aryl and $C_7$-$C_{12}$aralkyl;
a compound of formula (VII):

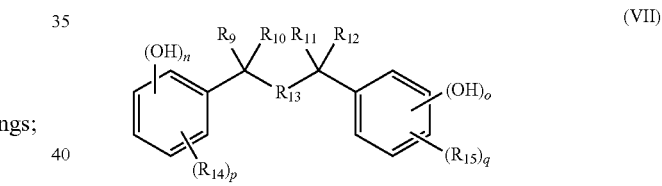

wherein n and o are integers from 1 to 4;
p and q are integers from 0 to 4;
$R_9$, $R_{10}$, $R_{11}$ and $R_{12}$ are the same or different and independently of each other selected from hydrogen, methyl, ethyl, linear or branched $C_3$-$C_6$alkyl; or
when $R_{13}$ is —$(CH_2)_r$— one of $R_9$ or $R_{10}$ and one of $R_{11}$ or $R_{12}$ taken together with the carbon atoms to which they are attached form a 5 to 8 membered substituted or unsubstituted carbocyclic ring where said substituents are selected from $C_1$-$C_6$alkyl;
$R_{13}$ is —$(CH_2)_r$— or phenylene, where r is 1 to 2;
$R_{14}$ and $R_{15}$ are the same or different and independently of each other selected from hydrogen, methyl, ethyl, linear or branched $C_3$-$C_6$alkyl, $C_3$-$C_8$cycloalkyl, $C_6$-$C_{10}$aryl and $C_7$-$C_{12}$aralkyl;
a compound of formula (VIII):

wherein $R_{16}$ and $R_{17}$ are the same or different and independently of each other selected from hydrogen, methyl, ethyl, linear or branched $C_3$-$C_6$alkyl;

a compound of formula (IX):

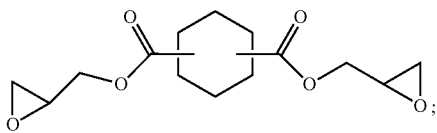

(IX)

and
a compound of formula (X):

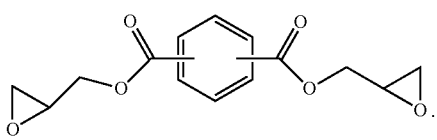

(X)

As noted above, the photosensitive composition of this invention generally contains a repeat units derived from the monomer of formula (I) along with various other repeat units derived from suitable other monomers as one of skill in the art readily appreciates. In some of the embodiments such suitable repeat units include for example a second type of repeating unit of formula (IIA) derived from a monomer of formula (II):

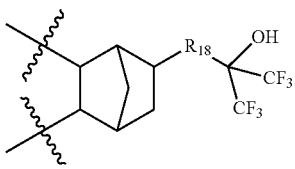

(IIA)

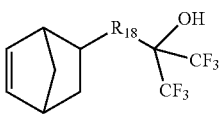

(II)

wherein ⌇ represents a position at which the bonding takes place with another repeat unit;

$R_{18}$ is selected from —$(CH_2)_s$—, —$(CH_2)_t$—$OCH_2$— or —$(CH_2)_t$—$(OCH_2CH_2)_u$—$OCH_2$—, where s is an integer from 0 to 6, t is an integer from 0 to 4 and u is an integer from 0 to 3.

In some other embodiments the photosensitive composition of this invention further includes a polymer encompassing a third type of repeating unit of formula (IIIA) derived from a monomer of formula (III):

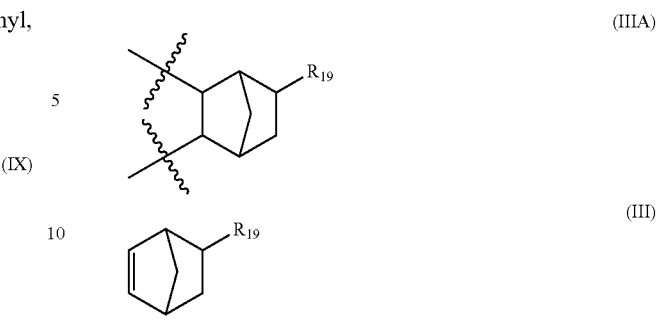

wherein represents a position at which the bonding takes place with another repeat unit;

$R_{19}$ is —$(CH_2)_v$—$CO_2R_{20}$ where v is an integer from 0 to 4, and $R_{20}$ is hydrogen or $C_1$-$C_4$alkyl.

In some embodiments, the polymer of this invention contains a repeat unit of formula (IIIA), in which $R_{20}$ is generally hydrogen. However, some embodiments may contain a polymer having a mixture of repeat units of formula (IIIA) in which portions of the repeat units of formula (IIIA) have $R_{20}$ as hydrogen and other portions of repeat units of formula (IIIA) have $R_{20}$ as $C_1$-$C_4$alkyl. Accordingly, it should be understood that all such variations are part of this invention as readily appreciated by one of skill in the art.

Accordingly, non-limiting examples of monomers that can be employed to make the polymers of this invention are enumerated below:

norbornenyl-2-trifluoromethyl-3,3,3-trifluoropropan-2-ol (HFANB), trioxanonanenorbornene (NBTON), tetraoxadodecanenorbornene (NBTODD), 5-(3-methoxybutoxy)methyl-2-norbornene (NB-3-MBM), 5-(3-methoxypropanoxy)methyl-2-norbornene (NB-3-MPM), ethyl 3-(bicyclo[2.2.1]hept-2-en-2-yl)propanoate (EPEsNB), bicyclo[2.2.1]hept-5-ene-2-carboxylic acid (Acid NB) and norbornenylpropanoic acid (NBEtCOOH).

It should however be noted that the photosensitive composition of this invention can be made by employing a polymer derived from any one or more of the monomers listed above.

In some embodiments of this invention the photosensitive composition of this invention is made by using a polymer derived from the following monomers or repeat units:

norbornenyl-2-trifluoromethyl-3,3,3-trifluoropropan-2-ol (HFANB), 3-(bicyclo[2.2.1]hept-2-en-2-yl)propanoic acid (NBEtCOOH), and trioxanonanenorbornene (NBTON).

In general, the polymer embodiments in accordance with the present invention encompass the above described one or more of the first, second and third distinct type of repeating units, as it will be seen below, other repeating units encompassed by such polymer embodiments are selected to provide properties to such polymer embodiments that are appropriate and desirable for the use for which such embodiments are directed, thus such polymer embodiments are tailorable to a variety of specific applications.

For example, polymer embodiments generally require at least one repeating unit directed to providing imageability. Thus distinct types of repeating units, represented by Structural Formula IIIa, can include $R_{19}$ being a carboxylic acid containing pendent group. However, any of the other functional group which would result in an acidic pendent moiety can also be used instead. Carboxylic acid pendent groups are generally useful for participating in a reaction with appropriately selected additives, or other repeating units that can lead to fix a positive-tone image via post develop thermal crosslinking. Thus, similar pendent groups including but not limited to phenolic, sulfonic and other functional groups may also work in this embodiment of the invention. It should further be noted that one of skill in the art readily appreciates that such polymer compositions containing acidic pendent groups can be made post polymerization by utilizing appropriate monomers. For example, a polymer containing NBEtCOOH monomer repeat units can generally be made by first forming the polymer using EPEsNB, and then hydrolyzing the ester function in the resulting polymer using any of the known procedures in the art. Thus certain residual amount of the ester monomeric repeat units may always present in the polymer employed herein. That is, when a polymer containing repeat units such as NBEtCOOH is used, such polymer may still contain some monomeric repeat units derived from EPEsNB.

When a polymer containing more than one repeat unit is used, such as for example, a polymer encompassing all of the three monomer repeat units of formula (IA), (IIA) and (IIA), any molar ratios of such monomer units can be used to form such a terpolymer. Examples of such monomer molar ratio can range from 1:1:98 to 98:1:1 to 1:98:1 respectively of (IA), (IIA), and (IIIA). In some other embodiments such ratios include 30:40:30, 40:30:30, 40:40:20, 40:45:15, 40:50:10, 45:40:15, 45:35:20, 50:35:15, 50:40:10 or any such combination.

In general, it has now been found that a polymer containing the monomer repeat unit having an acidic pendent group (generally of formula (IIIA)) advantageously provides certain beneficial effect for the photosensitive composition of this invention. Thus, in some embodiments of this invention, the polymer used in the photosensitive composition of this invention contains a monomer repeat unit containing the acid pendent group from about 10 to 80 mol %, and in some other embodiments from 20 to 70 mol %. In some other embodiments the molar percent of monomer repeat units of formula (IA) in the polymer may be from about 0 to 80 mol %, from about 10 to 80 mol % and in some other embodiments from about 20 to 70 mol %. In some other embodiments the molar percent of monomer repeat units of formula (IIA) in the polymer may be from about 0 to 80 mol %, from about 10 to 80 mol % and in some other embodiments from about 20 to 70 mol %.

It is further noted that it is not necessary to have all three monomers as noted hereinabove to form the appropriate polymer to provide the desirable results as noted herein. It has now been found that a homopolymer containing a repeat unit of any one of the formulae (IA), (IIA) or (IIIA) may also work in this invention. Further, a copolymer having any of the two repeat units of formulae (IA), (IIA) or (IIIA) may also function effectively as the polymer resin in the compositions of this invention. Even more particularly, it has now been found that a copolymer of HFANB and NBEtCO$_2$H can be employed in the photosensitive compositions of this invention. In addition, as already noted above, a terpolymer is used in some of the embodiments of this invention.

The polymers employed in the photosensitive compositions according to this invention generally exhibit a weight average molecular weight ($M_w$) of at least about 5,000. In another embodiment, the polymer employed in this invention has a $M_w$ of at least about 7,000. In yet another embodiment, the polymer has a $M_w$ of at least about 500,000. Further, in an embodiment of this invention the polymer employed herein exhibits a weight average molecular weight of from 5,000 to 500.000, or from 7.000 to 200,000 or from 8,000 to 100,000. The weight average molecular weight ($M_w$) and the number average molecular weight ($M_n$) are generally determined by gel permeation chromatography (GPC) using polystyrene calibration standards. However, any of the other known methods can also be used to determine $M_w$ and $M_n$. From this the polydispersity index (PDI) of the polymer can also be determined ($M_w/M_n$).

In another aspect of this invention, the photosensitive composition of this invention contains a photoactive compound which generally contains a photo active diazo-quinone moiety. Such photoactive compounds (PACs) are known to undergo photo-rearrangement when subjected to actinic (or electromagnetic) radiation of suitable wavelength, such as for example 254, 365, 405, or 436 nm depending upon the nature of the PAC employed the wavelength of the radiation can be modified by employing suitable light source. For example, in some embodiments of this invention the PACs employed contain one or more of the diazo-quinone moiety represented by formula (C), (D) or (E):

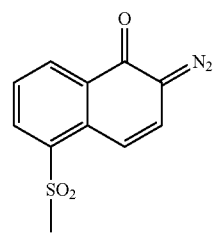

(C)

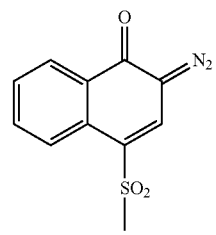

(D)

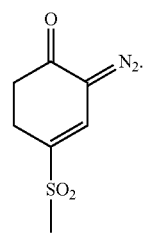

(E)

Generally, the structures of Formulae (C), (D) and/or (E) are incorporated into the photosensitive composition as an esterification product of the respective sulfonyl chloride (or other reactive moiety) and a phenolic compound, such as one of structures b-1 through b-6 shown below, each generally referred to as a photoactive compound or PAC, as discussed above. Thus, any one, or any mixture of two or more of such PACs are combined with the polymer in forming a positive tone composition embodiment of the present invention. In each of Formulae (b-1) through (b-6), Q represents any of the structures of Formulae (C), (D) or (E). Advantageously, when a portion of a film or a layer of the photosensitive composition is exposed to appropriate actinic or electromagnetic radiation, these esterification products generate a carboxylic acid which enhances the solubility of such exposed portion in an aqueous alkali solution as compared to any unexposed portions of such film. Generally, such photosensitive materials are incorporated into the composition in an amount from 5 to 50 pphr polymer, where the specific ratio of the photosensitive material to polymer is a function of the dissolution rate of exposed portions as compared to unexposed portions and the amount of radiation required to achieve a desired dissolution rate differential. Advantageous photosensitive materials useful in embodiments in accordance with the present invention are shown in Formulae b-1 through b-6 below; additional useful photosensitive materials are exemplified in U.S. Pat. No. 7,524,594 B2 columns 14-20, pertinent portions of which are incorporated herein by reference:

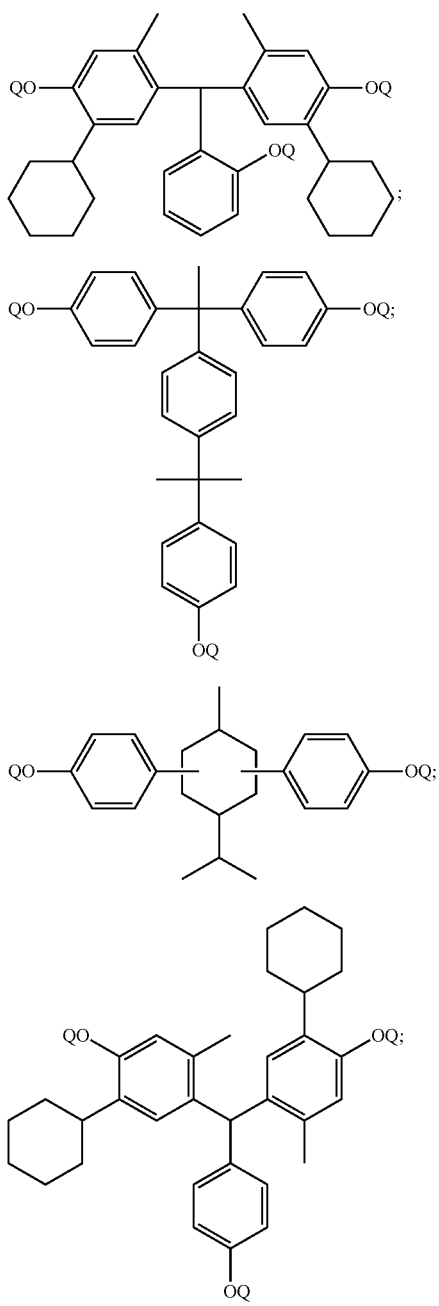

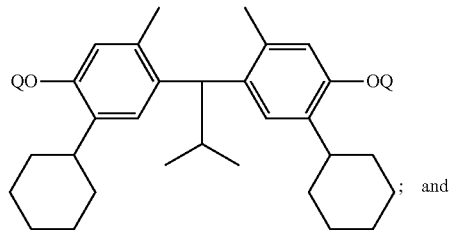

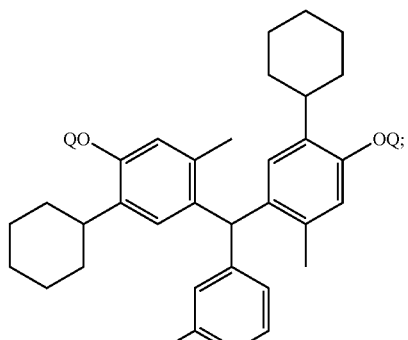

where at least one of Q is a group of the formula (C) or (D) and any remaining Q is hydrogen. An example of such photoactive compound available commercially include TrisP-3M6C-2(4)-201 from Toyo Gosei.

Any amount of photoactive compound can be employed in the photosensitive composition of this invention which brings about the desired results as described herein. Generally, such amount can range from 1 to 50 parts per hundred parts by mass (pphr) of the polymer as described herein. In some other embodiments such amount can range from 5 to 30 pphr.

The photosensitive compositions of the present invention also include additives that are advantageously capable of bonding with the pendant acidic group of the polymer resin. Such materials include, but are not limited to, additives that incorporate one or more epoxy groups such as a glycidyl group, a epoxycyclohexyl group, an oxetane group; an oxazoline group such as 2-oxazoline-2-yl group, a methylol group such as a N-hydroxy methylaminocarbonyl group or an alkoxymethyl group such as a N-methoxy methylaminocarbonyl group. Generally, the aforementioned bonding with the pendant acid group of the polymer is a cross-linking reaction that is initiated by heating to an appropriate temperature, generally above 110° C. for an appropriate amount of time. Accordingly, in some embodiments of this invention, the photosensitive composition of this invention, without any limitation, contains one or more epoxy compounds selected from the following:

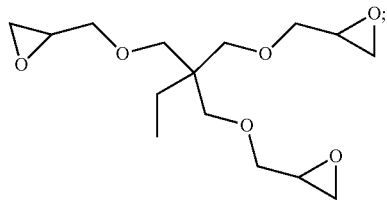

2,2'-(((2-ethyl-2-((oxiran-2-ylmethoxy)methyl)propane-1,3-diyl)bis(oxy))bis(methylene))bis(oxirane), commercially available as Denacol EX321 (Nagase)

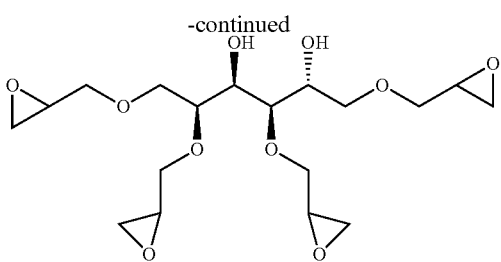

(2R,3R,4R,5S)-1,3,5,6-tetrakis(oxiran-2-ylmethoxy)hexane-2,4-diol
(also known as tetrakis-O-(oxiranylmethyl)-D-glucitol)
(Denacol EX-614 from Nagase); and

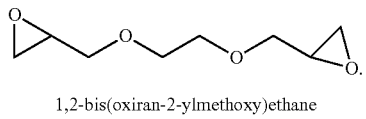

1,2-bis(oxiran-2-ylmethoxy)ethane

Other exemplary cross-linking or crosslinkable materials that can be used as additives in the forming of a photosensitive composition of the present invention include, among others, bisphenol A epoxy resin, bisphenol F epoxy resin, silicone containing epoxy resins or the like, propylene glycol diglycidyl ether, polypropylene glycol diglycidyl ether, glycidyloxypropyltrimethoxysilane, polymethyl(glycidyloxypropyl)cyclohexane or the like; polymers containing oxazoline rings such as 2-methyl-2-oxazoline, 2-ethyl-2-oxazoline, 1,3-bis(2-oxazoline-2-yl)benzene, 1,4-bis(2-oxazoline-2-yl)benzene, 2,2'-bis(2-oxazoline), 2,6-bis(4-isopropyl-2-oxazoline-2-yl)pyridine, 2,6-bis(4-phenyl-2-oxazoline-2-yl)pyridine, 2,2'-isopropylidenebis(4-phenyl-2-oxazoline), (S,S)-(−)-2,2'-isopropylidenebis(4-tert-butyl-2-oxazoline), poly(2-propenyl-2-oxazoline) or the like; N-methylolacrylamide, N-methylol methacrylamide, furfuryl alcohol, benzyl alcohol, salicyl alcohol, 1,2-benzene dimethanol, 1,3-benzene dimethanol, 1,4-benzene dimethanol and resole type phenol resin or mixtures thereof. It has been found that, in general, such materials are effective at loadings from 5 pphr polymer to 40 pphr polymer. However it should be understood that loadings higher or lower may also prove effective as their efficacy is dependent, at least in part, on the nature of the polymer employed and its mole percent of repeat units encompassing crosslinkable pendent groups.

In another aspect of this invention the photosensitive composition contains a compound or a mixture of compounds that are useful in enhancing the properties of the compositions, including but not limited to increasing the photo-speed and dissolution properties, among various other uses. Advantageously, it has now been found that a compound of formula (XI) can be used as an additive in accordance with the practice of this invention:

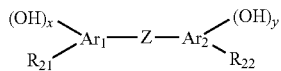 (XI)

Where x and y are integers from 0 to 4. $R_{21}$ and $R_{22}$ are the same or different and independently of each other selected from hydrogen, halogen, methyl, ethyl, linear or branched $C_3$-$C_{18}$alkyl, $C_1$-$C_{18}$perfluoroalkyl, methoxy, ethoxy, linear or branched $C_3$-$C_{18}$alkoxy, $C_3$-$C_{16}$cycloalkyl, $C_6$-$C_{16}$bicycloalkyl, $C_8$-$C_{16}$tricycloalkyl, $C_6$-$C_{10}$aryl, $C_7$-$C_{18}$aralkyl, —$(CH_2)_wCO_2R_{23}$, —$(CH_2)_zOR_{24}$. $Ar_1$ and $Ar_2$ are the same or different and independently of each other selected from $C_6$-$C_{10}$aryl, $C_7$-$C_{18}$aralkyl, where the aryl or aralkyl groups can further be substituted with any of the possible substituents which are known to one skilled in the art. Z is selected from a bond, O, S, P, —NR—, —C(=O)—, —C(=O)—O—, —C(=O)—NR—, —SO—, —SO$_2$—, —SO$_2$NH— alkyl or any of the carbocyclic bridging group including, cycloalkyl, heterocycloalkyl, aryl, aralkyl, and the like. Where any of the cycloalkyl, bicycloalkyl or tricycloalkyl rings may contain one or more heteroatoms selected form O, S, N, P and Si. Where w is an integer from 0 to 8, $R_{23}$ is hydrogen, methyl, ethyl, linear or branched $C_1$-$C_{18}$alkyl. Where z is an integer from 0 to 8, $R_{24}$ is hydrogen, methyl, ethyl, linear or branched $C_3$-$C_{18}$alkyl. Where R is hydrogen, methyl, ethyl, linear or branched $C_3$-$C_{18}$alkyl $C_1$-$C_{18}$perfluoroalkyl, $C_3$-$C_{16}$cycloalkyl, $C_6$-$C_{16}$bicycloalkyl, $C_8$-$C_{16}$tricycloalkyl.

Non-limiting examples of additives encompassed by a compound of formula (IV) may be enumerated as follows:
2,2'-methylenediphenol (also referred to as 2,2'-bis(hydroxyphenyl)methane or o,o'-BPF);
4,4'-methylenediphenol;
2,2'-(ethane-1,1-diyl)diphenol;
4,4'-(ethane-1,1-diyl)diphenol;
2,2'-(propane-1,1-diyl)diphenol;
4,4'-(propane-1,1-diyl)diphenol;
2,2'-(propane-2,2-diyl)diphenol;
4,4'-(propane-2,2-diyl)diphenol;
2,2'-(4-methylpentane-2,2-diyl)diphenol;
4,4'-(4-methylpentane-2,2-diyl)diphenol;
2,2'-(5-methylheptane-3,3-diyl)diphenol;
4,4'-(5-methylheptane-3,3-diyl)diphenol
4,4'-(propane-2,2-diyl)bis(2-cyclohexylphenol);
4,4'-(2-methylpropane-1,1-diyl)bis(2-cyclohexyl-5-methylphenol);
5,5'-(cyclohexane-1,1-diyl)bis(([1,1'-biphenyl]-2-ol));
4,4'-(cyclohexane-1,1-diyl)bis(2-cyclohexylphenol);
4,4'-(4-methylcyclohexane-1,1-diyl)diphenol;
2-cyclohexyl-4-(2-(4-hydroxyphenyl)propan-2-yl)-5-methylphenol;
6,6'-methylenebis(2-(tert-butyl)-4-methylphenol);
6,6'-(2-methylpropane-1,1-diyl)bis(2,4-dimethylphenol);
4,4'-(2-methylpropane-1,1-diyl)bis(2-(tert-butyl)-5-methylphenol);
4-(4-hydroxybenzyl)benzene-1,2,3-triol (also known as 1,2,3-trihydroxy-4-[(4'-hydroxyphenyl)methyl]benzene;
and mixtures in any combination thereof.

Non-limiting examples of additives encompassed by a compound of formula (V) may be enumerated as follows:
2-cyclohexylphenol;
4-cyclohexylphenol;
2-cyclohexyl-5-methylphenol;
2,4-di-sec-butylphenol;
2,6-di-tert-butyl-4-methylphenol;
2,4-di-tert-butylphenol;
4-dodecylphenol;
4-ethylresorcinol;
2-propylresorcinol;
4-butylresorcinol;
4-hexylresorcinol (also referred to as 4-hexylbenzene-1,3-diol);
and mixtures in any combination thereof.

Non-limiting examples of additives encompassed by a compound of formula (VI) may be enumerated as follows:
[1,1'-biphenyl]-2,2',4,4'-tetraol;
2'-methyl-[1,1'-biphenyl]-2,3,4,4'-tetraol;

[1,1'-biphenyl]-2,2',4,4',6-pentaol;
[1,1'-biphenyl]-2,2',3,4,4'-pentaol;
and mixtures in any combination thereof.

Non-limiting examples of additives encompassed by a compound of formula (VII) may be enumerated as follows:
4,4',4''-(butane-1,1,3-triyl)tris(2-(tert-butyl)-5-methylphenol);
4,4'-(4-isopropyl-1-methylcyclohexane-1,3-diyl)diphenol;
4,4'-(1,4-phenylenebis(propane-2,2-diyl))bis(2-cyclohexyl-5-methylphenol);
4,4'-(1,3-phenylenebis(propane-2,2-diyl))bis(2-cyclohexyl-5-methylphenol);
4,4'-(1,4-phenylenebis(propane-2,2-diyl))bis(2-cyclohexylphenol);
4,4'-([1,1'-bi(cyclohexane)]-4,4'-diyl)diphenol;
4-(4-(4-hydroxyphenyl)cyclohexyl)-2-methylphenol;
and mixtures in any combination thereof.

Non-limiting examples of additives encompassed by a compound of formula (VIII) may be enumerated as follows:

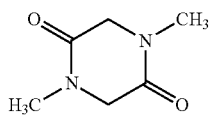

1,4-dimethylpiperazine-2,5-dione (also known as sarcosine anhydride);
1-ethyl-4-methylpiperazine-2,5-dione;
1,4-diethylpiperazine-2,5-dione;
1-methyl-4-propylpiperazine-2,5-dione;
1-ethyl-4-propylpiperazine-2,5-dione;
1-ethyl-4-isopropylpiperazine-2,5-dione;
and mixtures in any combination thereof.

Non-limiting examples of additives encompassed by a compound of formula (IX) may be enumerated as follows:
bis(oxiran-2-ylmethyl)cyclohexane-1,2-dicarboxylate;
bis(oxiran-2-ylmethyl)cyclohexane-1,3-dicarboxylate;
bis(oxiran-2-ylmethyl)cyclohexane-1,4-dicarboxylate;
and mixtures in any combination thereof.

Non-limiting examples of additives encompassed by a compound of formula (X) may be enumerated as follows:
bis(oxiran-2-ylmethyl)phthalate;
bis(oxiran-2-ylmethyl)isophthalate;
bis(oxiran-2-ylmethyl)terephthalate;
and mixtures in any combination thereof.

In general among other things, the additives as described herein improve overall performance of the photosensitive compositions of this invention thus providing well defined photo-patterned structures having a variety of utilities, including but not limited to chip-stack applications, redistribution layers and for forming CMOS image sensor dam structures. Advantageously, it has also been found that certain of the additives as described herein may feature more than one function. For example, the additives represented by formulae (IX) or (X) may not only exhibit certain dissolution enhancement activity post-exposure but may also facilitate as a cross linking agent as further described above. Therefore, additive as used herein does not limit the activity of such compounds to only one of such property but may also facilitate other functions of the photosensitive compositions of this invention.

It should further be noted that any of the additives noted above and represented by structural formulae (IV) to (X) can be used alone, i.e., as a single compound and/or a combination of one or more compounds in any combination thereof.

That is, for example, in some embodiments one or more compounds of formula (IV) may be used in combination with any of the other compounds of formula (V) to (X), such as for example a compound of formula (IV) in combination with a compound of formula (VIII). In addition, the amount of the additive that can be used depends upon the intended result with the photosensitive composition of this invention. Accordingly, any amount that would bring about the intended result can be used in this invention. In general, the amount of additive that can be used can range from 0.5 to 20 pphr, and in some embodiments such amounts are in the range of from 1 to 12 pphr.

It has further been found that various other compounds described by structural formulae (XIa)-(XIh) can also be used as one or more additives, alone or in combination with any of the compounds of formulae (IV) to (X) enumerated above in order to form the photosensitive compositions of this invention. It should further be noted that these additives, i.e., compounds described by structural formulae (XIa)-(XIh), can be used alone or as a mixture in any combination thereof, and in any desirable amounts. Non-limiting examples of additives encompassed by a compound of formula (XI) may be enumerated as follows:

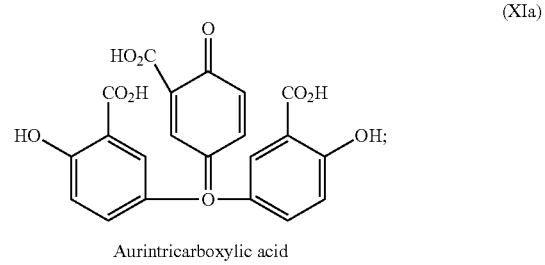

Aurintricarboxylic acid

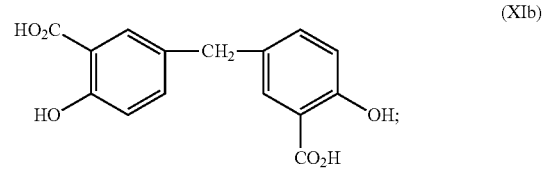

5,5'-Methylenedisalicylic acid

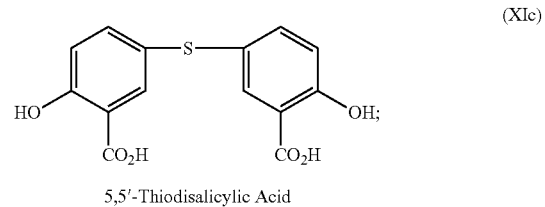

5,5'-Thiodisalicylic Acid

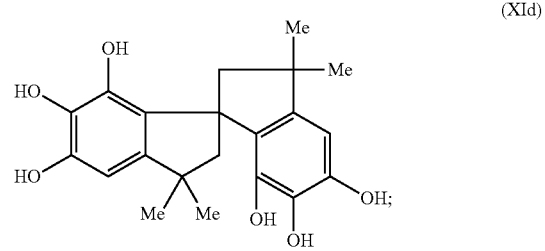

3,3,3',3'-Tetramethyl-1,1'-spirobiindan-5,5',6,6',7,7'-hexol

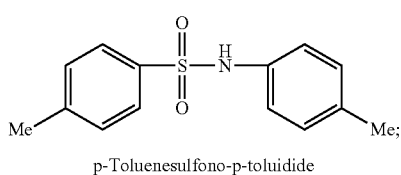

p-Toluenesulfono-p-toluidide

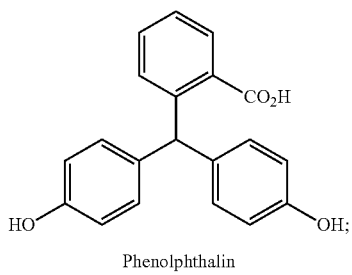

Phenolphthalin

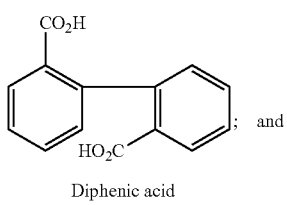
; and

Diphenic acid

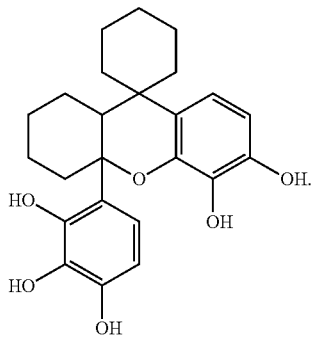

4-(5′,6′-dihydroxy-1′,3′,4′,9a′-tetrahydrospiro[cyclohexane-1,9′-xanthen]-4a′(2′H)-yl)benzene-1,2,3-triol, also commonly known as Pyrogallol-FZ In a further aspect of this invention various other additives which may be suitable to use with the composition of this invention include, without any limitation, the following:

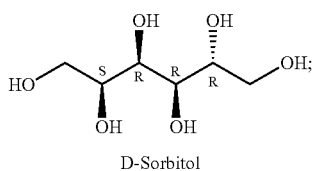

D-Sorbitol (XIe)

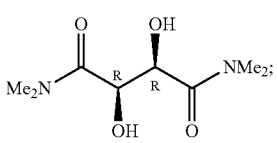 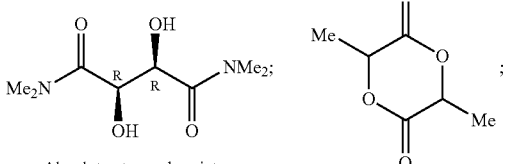

Absolute stereochemistry, Rotation (+) (+)-N,N,N′,N′-Tetramethyl-L-tartaric acid diamide Lactide (XIf)

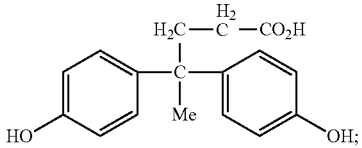

Diphenolic acid (XIg)

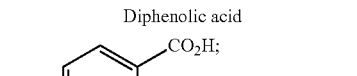

2,3,4-Trihydroxybenzoic acid 2,3,4-Trihydroxybenzoic acid (hydrate)

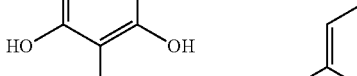

4,5-Dihydroxymethyl-2-phenylimidazole (XIh)

The photosensitive composition of this invention further encompasses one or more compounds having utility as, among other things, adhesion promoters, antioxidants, crosslinking, coupling or curing agent, and the like. Non-limiting examples of such compounds are selected from the group consisting of the following, commercially available materials are indicated by such commercial names.

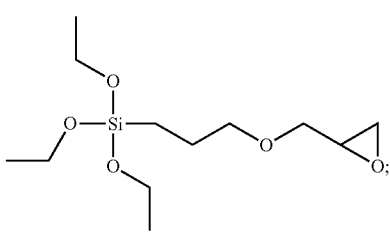

triethoxy(3-(oxiran-2-ylmethoxy)propyl)silane, also commonly known as 3-glycidoxypropyl triethoxysilane (3-GTS or (KBE-403 from Shin-Etsu Chemical Co., Ltd.))

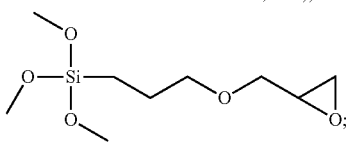

trimethoxy(3-(oxiran-2-ylmethoxy)propyl) silane, also commonly known as 3-glycidoxypropyl trimethoxysilane (KBM-403 from Shin-Etsu Chemical Co., Ltd.))

-continued

C₆H₅(C₂H₅O)₃Si phenyltriethoxysilane
(KBE-103 from
Shin-Etsu Chemical Co., Ltd.)

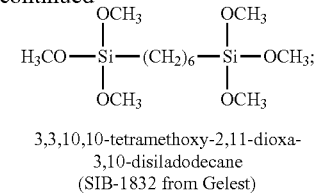

3,3,10,10-tetramethoxy-2,11-dioxa-
3,10-disiladodecane
(SIB-1832 from Gelest)

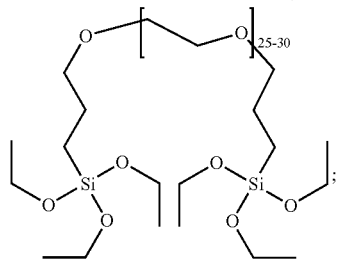

N,N'-bis[(3-triethoxysilylpropyl)
aminocarbonyl]polyethylene
oxide (SIB-1824.84 from Gelest)

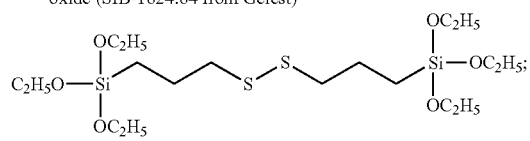

4,4,13,13-tetraethoxy-3,14-dioxa-8,9-dithia-4,13-disilahexadecane

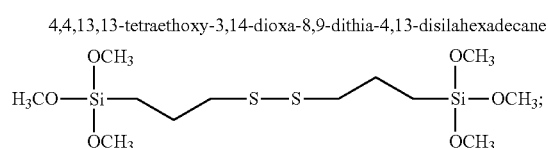

3,3,12,12-tetramethoxy-2,13-dioxa-7,8-dithia-3,12-
disilatetradecane (Si-75 or Si-266 from Evonik)

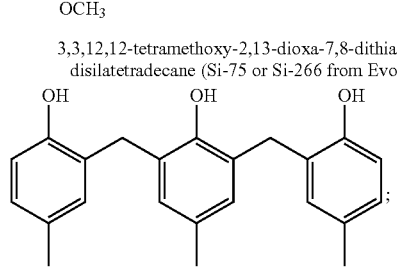

2,2'-((2-hydroxy-5-methyl-1,3-
phenylene)bis(methylene))bis(4-methylphenol)
(Antioxidant 80 from TCI Japan)

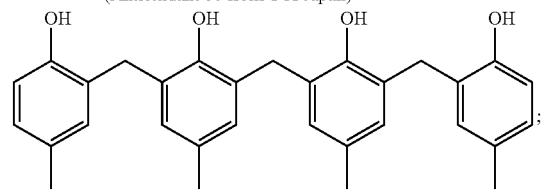

6,6'-methylenebis(2-(2-hydroxy-5-methylbenzyl)-4-methylphenol)
(4-PC)

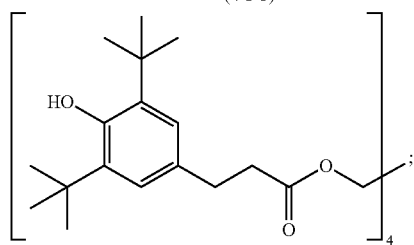

pentaerythritol tetrakis(3-(3,5-di-tert-butyl-4-
hydroxyphenyl)propionate)
(Irganox 1010 from BASF)

-continued

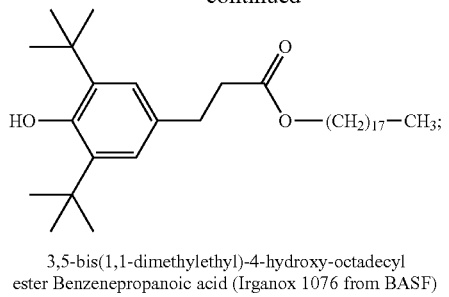

3,5-bis(1,1-dimethylethyl)-4-hydroxy-octadecyl
ester Benzenepropanoic acid (Irganox 1076 from BASF)

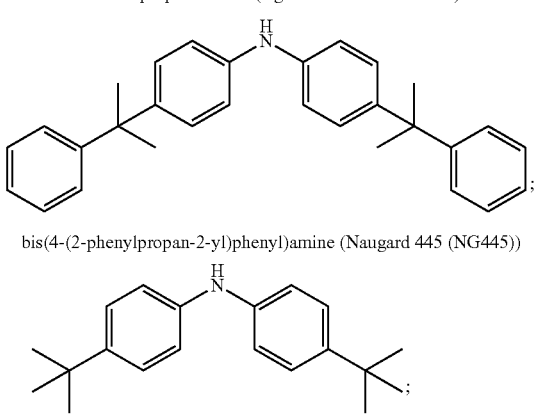

bis(4-(2-phenylpropan-2-yl)phenyl)amine (Naugard 445 (NG445))

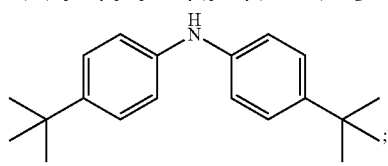

bis(4-(tert-butyl)phenyl)amine
(Stearer Star from Seiko Chemical Products)

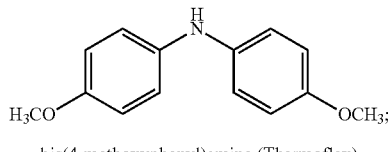

bis(4-methoxyphenyl)amine (Thermoflex)

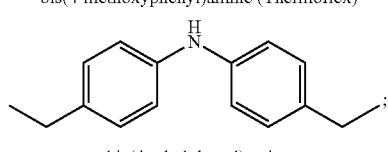

bis(4-ethylphenyl)amine

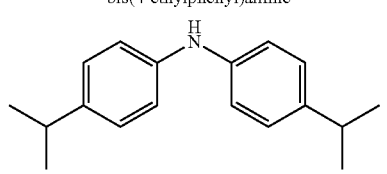

bis(4-isopropylphenyl)amine

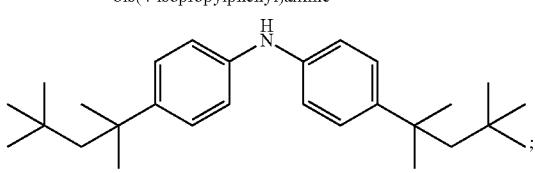

bis(4-(2,4,4-trimethylpentan-2-yl)phenyl)amine
(Irganox 5057 from BASF)

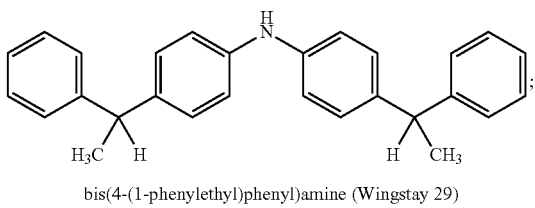

bis(4-(1-phenylethyl)phenyl)amine (Wingstay 29)

-continued

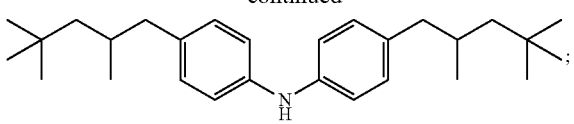

bis(4-(2,4,4-trimethylpentyl)phenyl)amine (Irganox L 57 from BASF)

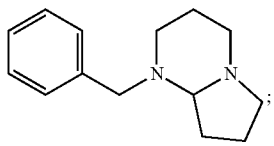

1-benzyloctahydropyrrolo[1,2-a]
pyrimidine (CGI-90 from BASF)

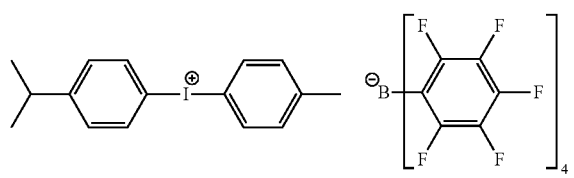

tetrakis(2,3,4,5,6-pentafluorophenyl)borate(1-)[4-(1-methylethyl)phenyl]
(4-methylphenyl)-Iodonium (Rhodorsil PI 2074 from Blue Star Silicones)

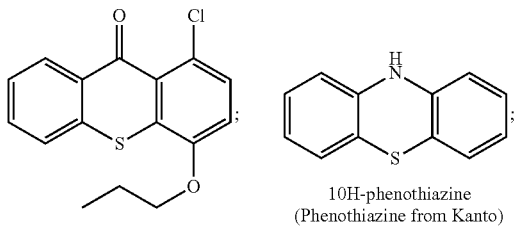

1-chloro-4-propoxy-9H-
Thioxanthen-9-one
(CPTX from Lambson PLC)

10H-phenothiazine
(Phenothiazine from Kanto)

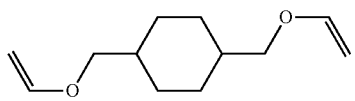

1,4-bis[(ethenyloxy)methyl]-cyclohexane
(Cyclohexane Divinyl ether (CHDVE))

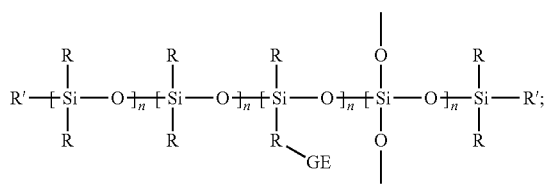

where GE = glycidyl ether (BY-16-115)

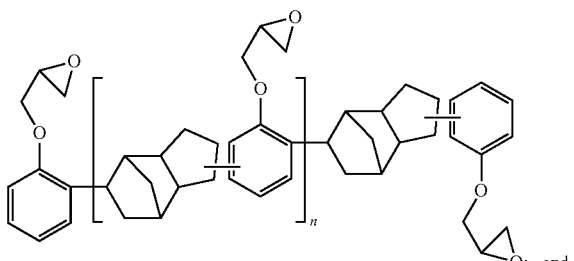

(HP-7200)

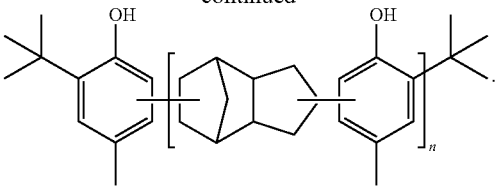

Lowinox CPL

It should again be noted that any one of these compounds can be used alone or as mixtures in any combination thereof. Again, any amount of one or more of aforementioned compounds can be used in the photosensitive composition of this invention so as to bring about the desired results. Generally it has now been found that such amounts can range from 0.5 to parts per hundred parts of the polymer resin (pphr). In some embodiments such amounts range from 1 to 10 pphr.

Photosensitive compositions in accordance with the present invention may also encompass other components as may be useful for the purpose of improving the properties of both the composition and the resulting film or the polymer layer. For example, the sensitivity of the composition to a desired wavelength of exposure radiation may result in improved desirable properties as further described below. Examples of such optional components may include without any limitation one or more compounds/various additives such as surfactants, silane coupling agents, leveling agents, phenolic resins, antioxidants, flame retardants, plasticizers, and curing accelerators.

The photosensitive composition embodiments, in accordance with the present invention, are first applied to a desired substrate to form a film. Such a substrate includes any appropriate substrate as is, or may be used for electrical, electronic or optoelectronic devices, for example, a semiconductor substrate, a ceramic substrate, a glass substrate. With regard to said application, any appropriate coating method can be employed, for example spin coating, spraying, doctor blading, meniscus coating, ink jet coating and slot coating.

Next, the coated substrate is heated to facilitate the removal of residual casting solvent, in for example to a temperature from 70° C. to 130° C. for from 1 to 30 minutes, although other appropriate temperatures and times can be used. After the heating, the film is generally imagewise exposed to an appropriate wavelength of actinic radiation, wavelength is generally selected based on the choice of the photoactive compound and/or photosensitizer incorporated into the polymer composition as described herein. However, generally such appropriate wavelength is from 200 to 700 nm. It will be understood that the phrase "imagewise exposure" means exposing through a masking element to provide for a resulting pattern of exposed and unexposed portion of the film.

After an imagewise exposure of the film formed from photosensitive composition or formulation embodiments in accordance with the present invention, a development process is employed. For the positive tone polymer formulations of the present invention, such development process removes only exposed portions of the film thus leaving a positive image of the masking layer in the film. For the negative tone polymer formulations of the present invention, such development process removes only unexposed portions of the film thus leaving a negative image of the masking layer in the film. For some embodiments, a post exposure bake can be employed prior to the aforementioned development process.

Suitable developers, particularly for positive tone formulations, can include aqueous solutions of inorganic alkalis such as sodium hydroxide, potassium hydroxide, sodium carbonate, ammonia, and aqueous solutions of organic alkalis such as 0.26N tetramethylammonium hydroxide (TMAH), ethylamine, triethylamine and triethanolamine. Where an organic alkali is used, generally an organic solvent essentially fully miscible with water is used to provide adequate solubility for the organic alkali. Aqueous solutions of TMAH are well known developer solutions in the semiconductor industry. Suitable developers can also include organic solvents such as propylene glycol methyl ether acetate (PGMEA), 2-heptanone, cyclohexanone, toluene, xylene, ethyl benzene, mesitylene and butyl acetate, among others.

Thus some formulation embodiments of the present invention provide self-imageable films that after imagewise exposure, the resulting image is developed using an aqueous base solution, while for other such embodiments the resulting image is developed using an organic solvent. Regardless of which type of developer is employed, after the image is developed, the substrate is rinsed to remove excess developer solution, typical rinse agents are water or appropriate alcohols and mixtures thereof.

After the aforementioned rinsing, the substrate is dried and the imaged film finally cured. That is to say, the image is fixed. Where the remaining layer has not been exposed during the imagewise exposure, image fixing is generally accomplished by causing a reaction within the remaining portions of the film. Such reaction is generally a cross-linking reaction that can be initiated by heating and/or non-imagewise or blanket exposure of the remaining material. Such exposure and heating can be in separate steps or combined as is found appropriate for the specific use of the imaged film. The blanket exposure is generally performed using the same energy source as employed in the imagewise exposure although any appropriate energy source can be employed. The heating is generally carried out at a desirable temperature, for example, from above 110° C. for a time of from 40 min to one or more hours. Where the remaining layer has been exposed during the imagewise exposure, image fixing is generally accomplished by a heating step to be tailored to complete any reaction initiated by the exposure. However an additional blanket exposure and heating, as discussed above, can also be employed. It should be realized, however, that the choice of a final cure process is also a function of the type of device being formed; thus a final fixing of the image may not be a final cure where the remaining layer is to be used as an adhesive layer or structure.

The devices are produced by using embodiments of the alkali soluble photosensitive resin composition of the present invention to form layers which are characterized as having high heat resistance, an appropriate water absorption rate, high transparency, and low permittivity. In addition, such layers generally have an advantageous coefficient of elasticity after curing, 0.1 kg/mm$^2$ to 200 kg/mm$^2$ being typical.

As previously mentioned, exemplary applications for embodiments of the photosensitive compositions in accordance with the present invention include die attach adhesive, wafer bonding adhesive, insulation films (interlayer dielectric layers), protecting films (passivation layers), mechanical buffer films (stress buffer layers) or flattening films for a variety of semiconductor devices, and printed wiring boards. Specific applications of such embodiments encompass a die-attach adhesive to form a single or multilayer semiconductor device, dielectric film which is formed on a semiconductor device; a buffer coat film which is formed on the passivation film; an interlayer insulation film which is formed over a circuit formed on a semiconductor device.

Accordingly, some embodiments in accordance with the present invention therefore provide a positive tone photosensitive polymer composition which exhibits enhanced characteristics with respect to one or more of mechanical properties (such as low-stress retained elongation to break after aging) and at least equivalent chemical resistance, as compared to alternate materials. In addition such embodiments provide generally excellent electrical insulation, adhesion to the substrate, and the like. Thus semiconductor devices, device packages, and display devices are provided that incorporate embodiments in accordance with the present invention.

Advantageously, it has now been found that the photosensitive compositions of this invention are useful to form adhesive layers for bonding the semiconductor chips to each other, such as in chip-stack applications. For example, a bonding layer used for such a purpose is composed of a cured product of the photosensitive adhesive composition of the present invention. Surprisingly, it has now been found that although the adhesive layer is a single-layer structure, it not only exhibits sufficient adhesiveness to the substrate but also is free of significant stress resulting due to the curing step. Accordingly, it is now possible to avoid undesirably thick layer of film encompassing the chip as a laminate. It has been further observed that the laminates formed in accordance with the present invention are reliable in that the relaxation of stress concentration between layers caused by thermal expansion difference or the like can be obtained. As a result, the semiconductor device having low height and high reliability can be obtained. That is, devices with low aspect ratio and low thickness can be obtained. Such semiconductor device becomes particularly advantageous to electronic equipment, which has very small internal volume and is in use while carrying as a mobile device, for example. Even more advantageously, by practice of this invention it is now possible to form a variety of electronic devices featuring hitherto unachievable level of miniaturization, thinning and lightweight, and the function of the semiconductor device is not easily damaged even if such devices are subject to rugged operations such as swinging or dropping.

A cured product of the photosensitive adhesive composition of the present invention. i.e., the adhesive layer or the film generally exhibits an indentation modulus of 2 to 3.5 GPa at 25° C. The cured product of the photosensitive adhesive composition of the present invention exhibits an indentation modulus of 70 to 120% of the indentation modulus of the non-cured product at 25° C. i.e., before such curing step. Further, the photosensitive adhesive composition of the present invention exhibits an excellent adhesiveness to a suitable substrate, such as for example a semiconductor chip, and adhesiveness of 20 to 200 Newton (N) at 25° C. can be achieved before curing and generally after etching and ashing process.

Thus, it has now been found that the photosensitive adhesive composition of the present invention exhibits an indentation modulus at room temperature after curing which is relatively comparable to the indentation modulus of the uncured sample and not causing significant stress concentration between the semiconductor chips but contributing to forming of the adhesive in layer with sufficient adhesiveness. Further, since the indentation modulus in a state before cured is within the predetermined range of indentation modulus after cured, and then, for example, it is not so possible that the photosensitive adhesive composition before cured is significantly deformed or flowed out, it is possible to increase the accuracy of alignment in laminating the semiconductor chips. Furthermore, since the change in indentation modulus before and after curing is relatively small, the shrinkage associated with photosensitivity can be reduced and then the stress at the interface between the semiconductor chips caused by shrinkage on curing can be reduced. This point also contributes to improvement of the reliability of the chip laminate.

On the other hand, advantageously, the photosensitive adhesive composition of the present invention in a state before cured after etching process and ashing process has sufficient stickiness with the semiconductor chip as required in die bonding. Therefore, the adhesive layer for bonding the semiconductor chips to each other securely fixes the semiconductor chips to each other and contributes to improvement of the reliability of the chip laminate.

From the above, according to the photosensitive adhesive composition of the present invention, it is possible to realize the adhesive layer having sufficiently both adhesiveness and stress relaxation. In other words, since the adhesive layer has both element protective function of buffer coat film (or, buffer coat function) and adhesive function of die bonding film (or, die bonding function) with a single layer, it is possible to form the chip laminate without decreasing the reliability and to thin the chip laminate as compared to the conventional one in two layers as well. Further, it is possible to reduce the volume of the mold portion and to shorten the bonding wire due to thinning of the chip laminate, thereby these factors contribute to light-weight and cost-savings.

Accordingly, in some of the embodiments, the indentation modulus of the cured product of the photosensitive adhesive composition of the present invention is generally 2 to 3 GPa at 25° C. as described above, and further, in some other embodiments it is about 2.2 to 3.2 GPa and few other embodiments it is about 2.4 to 3.0 GPa. Incidentally, with the indentation modulus of the cured product being less than the above lower limit, the adhesiveness of the adhesive layer is reduced, thereby the interface of the layer with the semiconductor chip is peeled, and, when the filler is contained in the mold part, the filler may pass through the adhesive layer and adversely affect the semiconductor chip. Meanwhile, with the indentation modulus of the cured product being more than the above upper limit, the flexibility of the adhesive layer is reduced, thereby stress relaxation is lowered and it is impossible to mitigate, for example, residual stress generated in accordance with lamination of the semiconductor chips and local concentration of thermal stress due to thermal expansion difference between the semiconductor chips and the adhesive layer. Consequently, cracks are made in the semiconductor chips, or the semiconductor chip and the adhesive layer are peeled off from each other. Such problems are readily overcome by the use of the photosensitive adhesive compositions of this invention.

In addition, the indentation modulus of the cured product is measured with a nanoindenter at 25° C.

Further, the melt viscosity of the photosensitive adhesive composition of the present invention in a state before cure is generally from about 20 to 500) Pascal-second (Pa·s) in the range of 100 to 200° C. Because such composition is superior in wettability with respect to the semiconductor chip 20 (FIG. 2), it becomes hard to generate voids or the like in the adhesive layer. Therefore, since it is possible to form homogeneous adhesive layers with little unevenness of physical properties, the adhesive layer hardly leads to local concentration of stress when the semiconductor chips are adhered together through the adhesive layer. Thereby, it is possible to inhibit the occurrence of cracks in the semiconductor chips and the occurrence of delamination between the adhesive layer and the semiconductor chip.

The melt viscosity of the cured photosensitive adhesive composition of the present invention may be measured by a rheometer. Accordingly, in some of the embodiments of this invention, the melt viscosity before cure is from about 25 to 400 Pa·s, and in some other embodiments it is from about 30 to 300 Pa·s.

Further, while the photosensitive adhesive composition of the present invention in a state before cure has certain adhesiveness, the adhesiveness can be decreased by performing UV irradiation thereon. Therefore, the photosensitive adhesive composition of the present invention may be controllable in adhesiveness depending on UV irradiation.

Specifically, the photosensitive adhesive composition of the present invention in a state before curing and after etching and ashing process as described above has stickiness generally greater than about 3.0 N/25 mm at 25° C. with respect to a back grinding tape capable of releasing upon IN irradiation. Since the photosensitive adhesive composition of the present invention may achieve sufficient stickiness with respect to the back grinding film even after performing certain processes such as etching process and ashing process accelerating the deterioration of the organic material, it is still possible to fix securely a semiconductor wafer, when dicing process is performed to the semiconductor wafer formed with a film of the photosensitive adhesive composition of the present invention, thereby dicing accuracy can be improved.

Accordingly, in some of the embodiments of this invention the stickiness (i.e., bond strength) referred to hereinabove is from 3.5 to 10.0 N/25 mm.

On the other hand, the photosensitive adhesive composition of the present invention in a state before cured and after UV irradiation has stickiness generally not more than 0.5 N/25 mm at 50° C. with respect to a back grinding tape capable of releasing upon UV irradiation. Since the photosensitive adhesive composition of the present invention features less tackiness with respect to the back grinding tape upon UV irradiation, when a chip is picked up after dicing process, it is easy to separate between the dicing tape and the coating film, thus preventing any potential defects, such as breaking of the chip, among others.

Further, by reducing stickiness (i.e., the tackiness), it is possible to inhibit, for example, the photosensitive adhesive composition of the present invention from sticking to the dicing blade in the dicing process, and sticking to the collet in the mounting process. As a result, it is possible to inhibit failure in dicing or picking-up from occurring.

Accordingly, in some of the embodiments of this invention the stickiness referred to hereinabove is from 0.05 N/25 mm 0.4 N/25 mm.

Further, the above UV irradiation process is a process of irradiating using light with wavelength of 365 nm with an exposure dose of up to 600 mJ/cm$^2$ in integrated amount of light. In some embodiments the exposure dose of the light source is in the range of from about 100 to 500 mJ/cm$^2$. In some other embodiments the exposure dose of the light source is in the range of from about 150 to 400 mJ/cm$^2$. In yet some other embodiments the exposure dose of the light source is in the range of from about 200 to 250 mJ/cm$^2$.

It has now been found that by employing the photosensitive compositions of this invention very high resolution circular vias can be formed. The resolution of the vias can be in the range from 1 to 100 μm. In some other embodiments, the resolution of the vias can be in the range from 3 to 30 μm. In yet some other embodiments, the resolution of the vias can be in the range from about 5 to 15 μm.

Further, the back-grinding UV peeling tape used in the above embodiments is generally made of acrylic resin. However, any other tape which can bring about the above noted result can also be employed.

Accordingly, in some embodiments of this invention as described above, the photosensitive composition is soluble in an alkali developer.

Further, in some embodiments of this invention as described above, the electronic and/or the semiconductor device according to this invention encompass a laminated semiconductor element where said lamination consists of a photosensitive composition according to the present invention.

In some embodiments of this invention, the semiconductor device encompassing a redistribution layer (RDL) structure further incorporates a photosensitive composition according to this invention.

Further, in some embodiments of this invention as described above, the semiconductor device encompassing a chip stack structure further includes a photosensitive composition according to this invention.

In yet some other embodiments of this invention as described above, the semiconductor device encompassing a complementary metal oxide semiconductor (CMOS) image sensor dam structure further incorporates a photosensitive composition according to this invention.

In addition, in some embodiments of this invention as described above, a film is formed by the photosensitive composition according to this invention. As further described above, such films generally exhibit excellent chemical, mechanical, elastic properties having a wide variety of utility in electronic, optoelectronic, microelectromechanical applications featuring excellent dielectric properties.

Accordingly, in some embodiments of this invention, there is provided a microelectronic or optoelectronic device encompassing one or more of a redistribution layer (RDL) structure, a chip-stack structure, a CMOS image sensor dam structure, where said structures further incorporates a photosensitive composition according to this invention.

Further, in some embodiments of this invention, there is provided a method of forming a film for the fabrication of a microelectronic or optoelectronic device comprising:

coating a suitable substrate with a composition according to the invention to form a film;

patterning the film with a mask by exposing to a suitable radiation;

developing the film after exposure to form a photo-pattern; and curing the film by heating to a suitable temperature.

The coating of the substrate with photosensitive composition of this invention can be performed by any of the coating procedures as described herein and/or known to one skilled in the art, such as by spin coating.

In addition, the developing in accordance with the method of this invention can be performed by any of the known developing techniques such as by the use of an aqueous developer.

In some embodiments of this invention, the method according to this invention utilizes a developer, which is aqueous tetramethylammonium hydroxide (TMAH).

In addition, in some of the embodiments of this invention, a substrate is first hardbaked in the method according to this invention before the curing step at a temperature of from 130° C. to 160° C. for 20 minutes to 60 minutes.

Finally, in some other embodiments of this invention, the curing is performed at a temperature of from 170° C. to 200° C. at an incremental heating ramp of 5° C. and for 1 to 5 hours.

Polymer Examples

The polymers used to form the photosensitive compositions of this invention are generally known in the literature and are prepared in accordance with the well-known literature procedures. See for example the copending U.S. patent application Ser. No. 13/741,809, filed Jan. 15, 2013, pertinent portions of which are incorporated herein by reference. A few of the representative polymer examples are provided below for illustrative purposes only.

Example 1

Terpolymer of HFANB/NBEtCOOH/NBTON (45/15/40 molar ratio, $M_w$=64,000) (P1)

An appropriately sized reaction vessel was dried under a flow of nitrogen gas for 60 minutes at ambient temperature. The vessel was then charged with toluene (830 g), ethyl acetate (EtOAc) (97 g), 1,1-bistrifluoromethyl-2-(bicyclo[2.2.1]hept-2-ene-5-yl)ethyl alcohol (HFANB), (123.4 g, 0.45 mol), ethyl 3-(bicyclo[2.2.1]hept-2-ene-2-yl)propanoate (EPEsNB) (17.3 g, 0.089 mol), and 5-((2-(2-methoxyethoxy)ethoxy)methyl)bicyclo[2.2.1]hept-2-ene (NBTON) (51.6 g, 0.23 mol). The solution was further purged with nitrogen for 30 minutes while heating at 45° C. to minimize air and water contamination. In a separate vessel, additional EPEsNB (13 g, 0.067 mol) and NBTON (42.8 g, 0.189 mol) were combined and purged with nitrogen for metering into the reaction vessel. After purging of the monomer solutions was completed, bis(toluene)bis(perfluorophenyl)nickel (4.8 g, 0.01 mol) dissolved in toluene (44 g) was injected into the reaction vessel. Simultaneously, the metered feed portion of the EPEsNB and NBTON monomers was added at such a rate to maintain a steady concentration of unreacted monomers until the polymerization was complete (3 hours).

After termination of the polymerization reaction any unreacted monomers were removed and the resulting polymer dissolved in methanol/heptanes (approximately 1.5 L total volume in a 1/5 ratio). The ester functionality was hydrolyzed by adding an aqueous solution of NaOH [10% by weight] (365 g), THF (440 g), and deionized water (250 g) to 610 g of the polymer solution and mixing the two phase solution for 4 hours at 60° C. Two acidifications followed consisting of 350 g methanol, 170 g THF, 75 g acetic acid, and 58 g formic acid. Each acidification was run for 15 minutes at 50° C. After each acidification the mixing was stopped and the organic and aqueous phases were allowed to separate, and the top phase was decanted. This is followed by three aqueous alcohol washes consisting of 340 g methanol and 2066 g water, the two phase solution was stirred for 15 minutes at 60° C. The solvent ratios were kept constant in each of the water washes. Finally the polymer solution was diluted with methanol (608 g) and PGMEA (1215 g) and subjected to solvent exchange to isolate the polymer. Conversion: 94%; weight average molecular weight, $M_w$=64,000, and polydispersity (PD)=2.3.

The repeat unit composition of polymer P1 was measured by $^1$H-NMR; the molar ratio of the monomers were found to be: HFANB: 46 mol %, NBEtCOOH: 13 mol %, and NBTON: 41 mol % having the formula as shown:

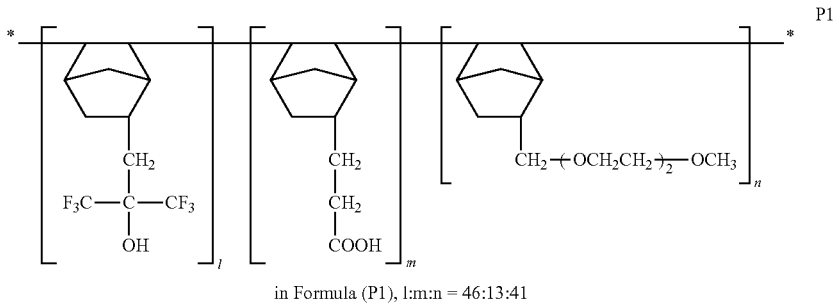

in Formula (P1), l:m:n = 46:13:41

Example 2

Terpolymer of HFANB/NBEtCOOH/NBTON
(45/15/40 molar ratio, $M_w$=86,000) (P2)

An appropriately sized reaction vessel was dried under a flow of nitrogen gas for 60 minutes at ambient temperature. The vessel was then charged with toluene (990 g), dimethoxyethane (DME) (120 g), HFANB (148 g, 0.54 mol), EPEsNB (20.7 g, 0.107 mol), and NBTON (61.9 g, 0.274 mol). The monomer solution was purged with nitrogen for 30 minutes while heating at 45° C. to minimize air and water contamination. In a separate vessel, additional EPEsNB (14.2 g, 0.073 mol) and NBTON (46.7 g, 0.206 mol) were combined and purged with nitrogen for metering into the reaction vessel. After purging of the monomer solutions was completed, bis(toluene)bis(perfluorophenyl)nickel (5.82 g, 0.012 mol) dissolved in toluene (60.5 ml) was injected into the reaction vessel containing all three monomers. Simultaneously, the metered feed portion of the EPEsNB and NBTON monomers was added at such a rate to maintain a steady concentration of unreacted monomers until the polymerization was complete (3 hours).

Any unreacted monomers were removed and the resulting polymer dissolved in methanol/THF (approximately 1 L total volume in a 4/5 ratio). The ester functionality was hydrolyzed using NaOH solution at a ratio of 4.8/1 NaOH/NaOAc for 4 hours at 60° C. Two acidifications followed consisting of 405 g methanol, 196 g THF, 87 g acetic acid, 67 g formic acid, and 21 g de-ionized water. Each acidification was run for 15 minutes at 50° C. After each acidification the mixing was stopped and the organic and aqueous phases were allowed to separate, and the top phase was decanted. This is followed by three aqueous alcohol washes consisting of 390 g methanol and 2376 g water for 15 minutes at 60° C. The solvent ratios were kept constant in each of the water washes. Finally the polymer was diluted in its final solvent and isolated by solvent exchange. Conversion: 93%: $M_w$=86,000, PD=2.5.

The molar repeat unit composition of polymer P2 was measured by $^1$H-NMR, and was found to be: HFANB: 46 mol %, NBEtCOOH: 15 mol %, and NBTON: 39 mol %.

Example 3

Copolymer of HFANB/NBEtCOOH (P3)

An appropriately sized reaction vessel was dried under a flow of nitrogen gas for 60 minutes at ambient temperature. The vessel was then charged with toluene (18.3 Kg), dimethoxyethane (DME) (2.4 Kg). HFANB, (4.92 Kg, 17.93 mol) and EPEsNB (584 g, 3 mol). The monomer solution was purged with nitrogen for 30 minutes to minimize air and water contamination. The reaction vessel was then heated to 55° C. In a separate vessel, additional EPEsNB (642 g, 3.3 mol) and toluene (2616 g) were combined and purged with nitrogen for metering into the reaction vessel. After purging of the monomer solutions was completed, bis(toluene)bis(perfluorophenyl)nickel (116.49 g, 0.24 mol) dissolved in toluene (1058 g) was metered into the reaction vessel over a period of 2 minutes. Simultaneously, the metered feed portion of the EPEsNB monomer was added at such a rate to maintain a steady concentration of unreacted monomers until the polymerization was complete (3 hours).

Any unreacted monomers were removed and the resulting polymer dissolved in methanol/THF (approximately 1 L total volume in a 4/5 ratio). The ester functionality was hydrolyzed using NaOH solution at a ratio of 4.8/1 NaOH/NaOAc for 4 hours at 60° C. Two acidifications followed consisting of 405 g methanol, 196 g THF, 87 g acetic acid, 67 g formic acid, and 21 g de-ionized water. Each acidification was run for IS minutes at 50° C. After each acidification the mixing was stopped and the organic and aqueous phases were allowed to separate, and the top phase was decanted. This is followed by three aqueous alcohol washes consisting of 390 g methanol and 2376 g water for 15 minutes at 60° C. The solvent ratios were kept constant in each of the water washes. Finally the polymer was diluted in its final solvent and isolated by solvent exchange. Conversion: 93%; $M_w$=134,000, PD=2.2.

The molar repeat unit composition of polymer P3 was confirmed by $^1$H-NMR.

Examples 4-12

Example 1 was substantially repeated in Examples 4-12 while utilizing appropriate quantities of various monomers as summarized in Table 1. The percent conversion of monomers into the polymer, the weight average molecular weight and the polydispersity index of the polymer thus obtained are also summarized in Table 1.

TABLE 1

| Polymer Example No. | HFANB | NBEtCOOH | NBTON | % Conversion | $M_w$ (x1000) | PDI |
|---|---|---|---|---|---|---|
| P4 | 44.4 | 14.3 | 41.3 | 94 | 65.4 | 1.4 |
| P5 | 35.9 | 12.2 | 51.8 | 97 | 57.3 | 1.7 |

TABLE 1-continued

| Polymer Example No. | HFANB | NBEtCOOH | NBTON | % Conversion | $M_w$ (x1000) | PDI |
|---|---|---|---|---|---|---|
| P6 | 21.9 | 15.0 | 63.1 | 98 | 58.7 | 1.4 |
| P7 | 26.6 | 23.6 | 49.8 | 98 | 58.2 | 1.4 |
| P8 | 48.0 | 13.0 | 39.0 | 93 | 61.4 | 2 |
| P9 | 44.0 | 13.0 | 43.0 | 94 | 52.1 | 1.9 |
| P10 | 28.8 | 33.3 | 37.9 | 98 | 61.9 | 1.4 |
| P11 | 31.4 | 28.2 | 40.4 | 96 | 59.4 | 1.4 |
| P12 | 36.4 | 22.4 | 41.2 | 96 | 60.2 | 1.4 |

Formulation Examples

In general any of the polymers as described herein such as for example, polymer P1 was dissolved in a suitable solvent such as PGMEA having the specific amounts of additives, expressed as parts per hundred resin (pphr) (TrisP-3M6C as the PAC, Si-75 or SiB-1832 as adhesion promoter, Denacol EX321L as crosslinker, AO-80 and/or Naugard 445 as antioxidant) were mixed in an appropriately sized amber HDPE bottle with an appropriate amount of solvents. The mixture was rolled for 18 hours to produce a homogeneous solution. Particle contamination was removed by filtering the polymer solution through a 0.45 μm pore polytetrafluoroethylene (PTFE) disc filter under 35 psi pressure, the filtered polymer solution was collected in a low particle HDPE amber bottle and the resulting solution stored at 5° C.

To the above noted formulation various other additives as described hereinabove are added to see the effect of each of the additive on the performance of the formulation. A control experiment contained no additive. Each of the additives was used to make two different formulations each containing respectively either 5 or 10 pphr of the additive.

Formulations thus formed were brought to room temperature and each of which was applied to a 125 mm diameter silicon wafer (thickness: 625 μm) by spin coating. The substrate was then placed on a 120° C. hot plate for 180 seconds, providing about a 11 μm thick polymer film. Each polymer film was then imagewise exposed through a range of exposure energies from 50-730 mJ/cm². Each film was then developed using a puddle development method having about six 30 second immersions in 0.26N TMAH. After the develop process each wafer was rinsed by spraying deionized water for 5 seconds and then dried by spinning at 3000 rpm for 15 seconds. Each film was then evaluated to determine the threshold energy required to give a 100 μm square via hole. It is evident from this experiment that the exhibited threshold energy of each of the formulation depended upon the type of additive. In general it was observed that a number of additives represented by structural formulae (IV) to (XI) exhibited surprisingly superior threshold energy values than various other compounds tested, thus surprisingly demonstrating that these compounds have the capability of improving the observed sensitivity of the imageable polymer film.

FIG. 1 shows comparative photolithographic images obtained using a representative composition of this invention which is compared with a composition having no additive as described herein. Specifically, FIGS. 1A and 1B show photolithographic images from a composition having no additive, which were taken respectively using a Stepper and a Mask Aligner at a threshold exposure dose of 325 mJ/cm². Whereas, FIGS. 1C and 1D respectively show Stepper and Aligner used photolithographic images with a composition of this invention containing 10 pphr of 2,2'-methylenediphenol at a threshold exposure dose of 225 mJ/cm². Both compositions otherwise contained the same ingredients as summarized in Table 2 and the polymer used was a polymer HFANB/NBEtCOOH/NBTON having a molar ratio of about 45/15/40. The images were taken using Nikon Optiphot-88 equipped with Diagnostic Instruments 25.4 2 Mp Slider camera assembly. The light grey areas in these FIGS. 1A through 1D represent the post-exposure developed areas.

It is quite evident from these photographs that use of an additive in accordance with this invention surprisingly improves the photospeed of the composition. That is, similar or better resolution images can be obtained at much lower radiation dosages, i.e., 225 mJ/cm² with additive features better resolution images when compared with 325 mJ/cm² exposed images without any additive.

Formulation Example 1 (F1)

In an appropriately sized amber HDPE bottle were mixed a 35 weight % solution of Polymer P1 in PGMEA (498.4 g), TrisP-3M6C(4)-2-201 DNQ PAC (39.24 g, 22.5 wt. %), Si-75 (5.23 g, 3 wt. %). SIB-1832 (17.44 g, 10 wt. %), Denacol EX321L (34.88 g, 20 wt. %), Antioxidant 80 (11.34 g, 6.5 wt. %), Naugard 445 (17.44 g, 10 wt. %), and PGMEA (57.75 g). The mixture was rolled for >16 hours to produce a homogeneous solution of the polymer formulation. Particle contamination was removed by filtering the polymer solution through a 0.45 μm pore PTFE disc filter under 35 psi pressure, the filtered polymer solution was collected in a low particle HDPE amber bottle and the resulting solution was stored at 5° C.

Formulation Examples 2-7 (F2-F7)

Formulation Example 1 was substantially repeated in Formulation Examples 2-7 (F2-F7) with the exception of using different additives and at different weight percent of the compositions as summarized in Table 2.

TABLE 2

| | Formulations | | | | | |
|---|---|---|---|---|---|---|
| Ingredients | F2 | F3 | F4 | F5 | F6 | F7 |
| Polymer P1 | 100 | 100 | 100 | 100 | 100 | 100 |
| TrisP-3M6C(4)-2-201 | 22.5 | 22.5 | 22.5 | 22.5 | 22.5 | 22.5 |
| Si-75 | 3 | 3 | 3 | 3 | 3 | 3 |
| SIB-1832 | 10 | 10 | 10 | 10 | 10 | 10 |
| Denacol EX321-L | 20 | 20 | 20 | 20 | 20 | 20 |
| Anti-Oxidant 80 | 6.5 | 6.5 | 6.5 | 6.5 | 6.5 | 6.5 |
| Naugard 445 | 10 | 10 | 10 | 10 | 10 | 10 |
| o,o'-BPF | 5 | 10 | | | | |
| 2,3,4,4'-Tetrahydroxydiphenylmethane | | | 5 | | | |
| L-Sarcosine Anhydride | | | | 5 | 10 | |
| Diglycidyl 1,2-cyclohexanedicarboxylate | | | | | | 5 |

Evaluation of Threshold Energy (Eth) for
Formulations F1-F7

Formulation F1 was brought to ambient temperature before use. The photosensitive formulation F1 was applied to a 125 mm diameter silicon wafer (wafer thickness: 625 µm) by spin coating at 500 rpm of 10 seconds and then at 1200 rpm for 30 seconds on a CEE-200CB spin coater (Brewer Scientific). The substrate was then placed on a 120° C. hot plate for 3 minutes to remove residual solvent, providing a film with a thickness of 11.1 µm. An AB-M contact mask aligner fitted with an I line (365 nm) band pass filter was used to imagewise expose the polymer film through a masking element using a range of exposure energies from 50-730 mJ/cm². The latent image was developed with 0.26N TMAH solution (CD-26) using a puddle development method consisting of six 5 second spray and 30 second puddle immersion cycles. The wafer and patterned film was rinsed by spraying deionized water for 5 seconds to remove residual developer solvent and then dried by spinning at 3000 rpm for 15 seconds. The film was then evaluated with an Optiphot-88 microscope [Nikon] to determine the Eth required to open a residue free, 100 µm round via opening. Formulations F2 to F7 were evaluated in the manner described for F1. The Eth energy and minimum square via resolution data for formulations F1-F7 are presented in Table 3.

TABLE 3

| Formulation | Threshold Energy (mJ/cm²) | Minimum Resolution (µm square via) |
|---|---|---|
| F1 | 275 | 7 |
| F2 | 203 | 10 |
| F3 | 225 | 10 |
| F4 | 225 | 7 |
| F5 | 275 | 7 |
| F6 | 275 | 7 |
| F7 | 275 | 7 |

From the data presented in Table 3 it is evident that the photosensitive compositions in accordance with this invention, i.e., Formulations 1-7 exhibit excellent properties even when exposed to low energy radiation. The compositions of this invention exhibit excellent resolution as demonstrated by 7 µm via even at exposures as low as 200 to 225 mJ/cm².

Formulation Examples 8-16 (F8-F16)

Formulation Example 1 was substantially repeated in Formulation Examples 8-16 (F8-F16) with the exception of using different additives and at different weight percent of the compositions as summarized in Table 4.

TABLE 4

| | Formulation | | | | | | | | |
|---|---|---|---|---|---|---|---|---|---|
| Additive | F8 | F9 | F10 | F11 | F12 | F13 | F14 | F15 | F16 |
| Polymer* | P7 | P7 | P8 | P7 | P8 | P8 | P8 | P7 | P7 |
| TrisP-3M6C-2(4)-201 | 22.5 | 18 | 18 | 18 | 18 | 18 | 18 | 18 | 18 |
| Si-75 | 3 | 3 | 3 | 3 | 3 | 1.5 | 1.5 | 1.5 | 1.5 |
| KBE-103 | 10 | 10 | 10 | 10 | 10 | 0 | 0 | 0 | 0 |
| SIB-1824.84 | | | | | | 2.5 | 2.5 | 2.5 | 2.5 |
| Denacol EX321-L | 20 | 20 | 20 | 20 | 20 | 10 | 10 | 10 | 10 |
| EX-614 | | | | | | 10 | 10 | 10 | 10 |
| Anti-Oxidant 80 | 6.5 | 6.5 | 6.5 | 6.5 | 6.5 | 3.5 | 3.5 | 3.5 | 3.5 |
| Naugard 445 | 10 | 3.5 | 3.5 | 3.5 | 3.5 | 3.5 | 3.5 | 3.5 | 3.5 |
| o,o'-BPF | 10 | 5 | 5 | 5 | 5 | 7 | 7 | 7 | 7 |
| 4-hexyl resorcinol | 0 | 0 | 0 | 5 | 5 | 5 | 5 | 5 | 5 |
| L-Sarcosine Anhydride | 0 | 0 | 0 | 0 | 0 | 0 | 5 | 5 | 0 |

*The amount of polymer used in each of these examples is 100 parts with reference to the additives listed.

Evaluation of Threshold Energy (Eth) for
Formulations F8-F16

Formulation F8 was bought to ambient temperature before use. The photosensitive formulation F8 was applied to a 100 mm diameter silicon wafer (wafer thickness: 725 µm) by spin coating at 500 rpm of 10 seconds and then at 1000 rpm for 30 seconds on a CEE-200CB spin coater (Brewer Scientific). The substrate was then placed on a 120° C. hot plate for 4 minutes to remove residual solvent, providing a film with a thickness of 13.7 µm. A GCA AS200 i-line stepper (numerical aperture=0.45) was used to imagewise expose the polymer film through a masking element using a range of exposure energies from 125-500 mJ/cm². The latent image was developed with 0.26 N TMAH solution (CD-26) using a puddle development method consisting of two cycles consisting of a 5 second spray dispense step and a 30 second puddle immersion step. The wafer and patterned film was rinsed by spraying deionized water for 5 seconds to remove residual developer solvent and then dried by spinning at 3000 rpm for 15 seconds. The resolution of the pattern features was then evaluated visually with an Optiphot-88 microscope [Nikon] fitted with a 10× objective to determine the threshold energy (Eth) required to open a residue free, 100 µm square via opening. Formulations F9 to F16 were evaluated in the manner described for F8. The Eth energy and minimum square via resolution data for formulations F8-F16 are presented in Table 5.

TABLE 5

| Formulation | Threshold Energy (mJ/cm²) | Minimum Resolution (µm circular via) |
|---|---|---|
| F8 | 425 | 5 |
| F9 | 300 | 10 |
| F10 | 275 | 10 |
| F11 | 250 | 7 |
| F12 | 200 | 15 |
| F13 | 325 | 7 |

TABLE 5-continued

| Formulation | Threshold Energy (mJ/cm²) | Minimum Resolution (μm circular via) |
|---|---|---|
| F14 | 200 | 10 |
| F15 | 275 | 10 |
| F16 | 300 | 15 |

It is again evident from the data presented in Table 5 the formulations of this invention exhibit excellent properties at relatively low exposure energies.

Formulation Examples F17-F28

In an appropriately sized amber HDPE bottle were added appropriate amounts of Polymer P1 (Polymer P6 in Formulation Example F18 and Polymer P10 in Formulation Example F19). TrisP-3M6C(4)-2-201 DNQ as PAC, which is a photoactive compound of formula b-1 as described herein in which two of Qs are diazo moiety of formula D and the remaining Q is hydrogen, Denacol EX321L as the epoxy crosslinker (Epoxy). Each of these Formulation Examples F17-F28 also contained the following: 1,2,3-trihydroxy-4-[(4'-hydroxyphenyl)methyl]benzene (4 g). Antioxidant 80 (14 g). Naugard 445 (14 g), and PGMEA (21 g). Also added were the appropriate dissolution enhancement agents (DEA) in the appropriate amounts as summarized in Table 6. The respective amounts of polymer, DNQ PAC. Epoxy and the DEA used in each of these Formulation Examples F17-F28 are summarized in Table 6.

TABLE 6

Formulation Examples F17-F28

| Formulation Example No | Polymer (Parts) | DNQ PAC (Parts) | Epoxy (Parts) | DEA (Parts) |
|---|---|---|---|---|
| F17 | P1 (22) | 5 | 5 | A1 (3) |
| F18 | P6 (22) | 5 | 5 | A1 (3) |
| F19 | P10(22) | 5 | 5 | A1 (3) |
| F20 | P1 (22) | 5 | 5 | A2 (3) |
| F21 | P1 (22) | 5 | 5 | A3 (3) |
| F22 | P1 (19) | 8 | 2.5 | A1 (12) |
| F23 | P1 (27) | 4 | 8 | A1 (1.5) |
| F24 | P1 (14) | 6 | 9 | A1 (7.5) |
| F25 | P1 (24) | 6 | — | A1 (4) |
| F26 | P1 (23) | 6 | 6 | — |
| F27 | P1 (22) | 5 | 5 | A4 (3) |
| F28 | P1 (22) | 5 | 5 | A5 (3) |

DEA—Dissolution enhancement agent;
A1 - o,o'-BPF;
A2 - 4,4'-(4-methylpentane-2,2-diyl)diphenol;
A3 - 4-hexylresorcinol
A4 - 4,4'-(4-isopropyl-1-methylcyclohexane-1,3-diyl)diphenol; and
A5 - resorcinol.

The mixture was rolled for >16 hours to produce a homogeneous solution of the polymer formulation. Particle contamination was removed by filtering the polymer solution through a 0.45 μm pore PTFE disc filter under 35 psi pressure, the filtered polymer solution was collected in a low particle HDPE amber bottle and the resulting solution was stored at 5° C.

Measurement of Mechanical Properties of Photosensitive Resin Compositions
Measurement of Indentation Modulus of Formulations F17-F28 Before Thermal Cure The Formulation Examples F17-F28 were applied onto a Si wafer substrate coated with a release agent. The coatings were first baked at 120° C. for 5 minutes and then hard baked at 150° C. for a further 40 minutes. An indentation modulus of the photosensitive adhesive compositions was measured with a model ENT-1000 nanoindenter (ELIONIX INC.) at 25° C. For Formulation Example F28 the indentation modulus could not be measured due to the poor quality of the film sample.

Measurement of Indentation Modulus of Formulations F17-F28 after Thermal Cure

The Formulation Examples F17-F28 were applied to a Si wafer substrate which was coated with a release agent. The coatings were first baked at 120° C. for 5 minutes and then hard baked at 150° C. for further 40 minutes and finally at 175° C. for 120 minutes. An indentation modulus of the thermally cured photosensitive adhesive compositions was measured with a model ENT-1000 nanoindenter (ELIONIX INC.). For photosensitive resin composition F28 the indentation modulus could not be measured due to the poor quality of the film sample.

Evaluation of Adhesion to Semiconductor Element

Samples for evaluation were prepared by laminating several silicon semiconductor chips with each of photosensitive adhesive composition of Examples and Comparative Examples as described herein. Die shear strength (unit: N) was measured when bonding surface between chips was broken by pressing each sample in the horizontal direction from the side with a Dage 4000 Multipurpose Bond Tester (Nordson-Dage). Chip size was 4 mm squares.

As for the photosensitive adhesive composition of Formulation Example F28, it was not possible to measure the die shear strength.

Evaluation of Adhesiveness of a Coating Film (Before Cured) with Back Grinding Film after Etching Process and Ashing Process The photosensitive adhesive compositions as prepared in accordance with Formulation Examples F8 to F18 were applied onto semiconductor chips made of silicon and pre-baked for 5 minutes at 120° C. to obtain a coating film. Next, the coating film obtained was sequentially subjected to an RIE plasma etching process and dicing process. Etching process was performed using a mixed gas of a fluorinated hydrocarbon ($CF_4$), Argon (Ar) and Oxygen ($O_2$) under conditions that an output was 2500 W, time 6 minutes, and $CF_4$ flow rate. Ar flow rate and $O_2$ flow rate were 200 sccm, 200 sccm and 50 sccm, respectively. Ashing process was performed using a mixture of oxygen (02) and argon (Ar) under conditions that an output was 600 W, time 12 minutes, $O_2$ flow rate and Ar flow rate were 50 sccm and 150 sccm, respectively.

A back grinding film was laminated to the surface of the semiconductor element coated with the photosensitive resin composition. Lamination was performed at 25° C. with a model AL-500FR Laminator (Asahi Kasei) with a laminating pressure of 0.2 MPa. The speed of the laminating tape was 1 mm/minute. Each die was laminated to a tape segment 25 mm wide and 75 mm in length.

Then, the back grinding film was peeled off from the photosensitive adhesive composition at a peeling angle of 180°, the average applied load required to peel off the back grinding film (adhesive strength for peeling, unit peel: N/25 mm) was determined. The measurement temperature was 25° C., and speed for peeling was set to 10.0±0.2 mm/s.

As for the photosensitive adhesive compositions of Formulation Example F28, it was not possible to measure the adhesive force.

Evaluation of Adhesiveness of a Coating Film (Before Cured) with Back Grinding Film after Etching Process and Ashing Process and Further UV Irradiation Process Each photosensitive adhesive composition of Formulation Examples F17-F28 was applied onto semiconductor chips made of silicon and pre-baked for 5 minutes at 120° C. to obtain a coating film. Next, photosensitive adhesive composition coating was subjected to an RIE etching process and an ashing process. Etching process was performed using a mixed gas of a fluorinated hydrocarbon ($CF_4$), argon (Ar) and oxygen ($O_2$) under conditions that an output was 2500 W, time 6 minutes, and $CF_4$ flow rate. Ar flow rate and $O_2$ flow rate were 200 sccm, 200 sccm and 50 sccm, respectively. Ashing process was performed using a mixture of Oxygen ($O_2$) and Argon (Ar) under conditions that an output was 600 W, time 12 minutes, $O_2$ flow rate and Ar flow rate were 50 sccm and 150 sccm, respectively.

Next, a back grinding film in UV peeling type was adhered in a manner that its adhesive surface is to be in contact with the coating film. The back grinding film used was 25 mm in width and 75 mm in length.

Then, the back grinding film was peeled off from the coating film in peeling angle of 180° after subjected to 365 nm UV irradiation process of 600 mJ/cm² to back grinding film and coating film, and average of the load required to peel (adhesive strength for peeling, unit peel: N/25 mm) was determined. The measurement temperature was 25° C., and speed for peeling was set to 10.0±0.2 mm/s.

As for the photosensitive adhesive composition of Formulation Example F28, it was impossible to measure the adhesive force.

Evaluation of Minimum Melt Viscosity

The photosensitive adhesive compositions of Formulation Examples F17 to F28 were applied onto a substrate sheet with release agent painted, and hard baked for 60 minutes at 100° C. after pre-baked for 3 minutes at 120° C. Then, coating films were peeled off from the base sheets to obtain test pieces with a length of 20 mm, a width of 20 mm, and a film thickness of 100 μm. Regarding these test pieces, melt viscosity was measured at a frequency of 1 Hz while raising temperature from 30° C. to 220° C. at a rate of 10° C./imin in air using a Rheo Stress RS150 rheometer (HAAKE Co.). The minimum value of measured value was determined as the minimum melt viscosity.

As for the photosensitive adhesive composition of Formulation Example F28, used as Comparative Example, it was not possible to measure the minimum melt viscosity.

Evaluation of Presence or Absence of Cracks after Temperature Cycle Test (TCT)

Chip laminate was prepared by adhering the semiconductor chips made of silicon with each other via the photosensitive adhesive composition of Formulation Examples F17-F27 and Comparative Example F28. This was mounted on the package substrate using a die bonding sheet, and was sealed with a sealing material after wire bonding to obtain a semiconductor device. Conditions of sealing are 175° C. in mold temperature, 7 MPa in injection pressure, and 2 minutes in retention time, and after released, 175° C. in heating temperature and 2 hours in heating time.

Next, a hundred semiconductor devices thus obtained were subjected to temperature cycling test (each 30 minutes for high and low temperature) covering −55° C. to 125° C. in 500 cycles, and semiconductor devices after tested were observed with an ultrasonic flaw detector. Then, the observation results were evaluated based on the following evaluation criteria. Incidentally, as for the photosensitive adhesive composition of Comparative Example F28, it was not possible to produce a chip laminate. The following criteria were used in determining the quality of the film:

Criteria:
excellent: cracks or interfacial peeling are not observed at all.
good: cracks or interfacial peeling are observed less than 3%.
poor: cracks or interfacial peeling are observed not less than 3% to less than 5%.
bad: cracks or interfacial peeling are observed not less than 5%.

The results obtained in the aforementioned evaluations are tabulated in Tables 7 and 8. Table 7 summarizes the mechanical properties of the films formed from the Formulation Examples F17 through F28.

TABLE 7

Mechanical Properties of Formulation Examples F17-F28

| Formulation Example No | E' - Indentation Modulus Before Cure (GPa) | E' - Indentation Modulus After Cure (GPa) | Ratio of E' before cure/E' after cure (%) | Die Shear Adhesion to Chip (N) |
|---|---|---|---|---|
| F17 | 3.09 | 2.87 | 108 | 31 |
| F18 | 1.77 | 2.40 | 74 | 176 |
| F19 | 3.13 | 2.84 | 110 | 40 |
| F20 | 3.10 | 2.84 | 109 | 35 |
| F21 | 3.03 | 2.86 | 106 | 42 |
| F22 | 2.98 | 2.85 | 105 | 32 |
| F23 | 3.16 | 2.90 | 109 | 50 |
| F24 | 2.93 | 2.88 | 102 | 35 |
| F25 | 2.91 | 2.11 | 138 | 18 |
| F26 | 3.05 | 2.85 | 107 | 16 |
| F27 | 3.09 | 2.88 | 107 | 8 |
| F28 | — | — | — | — |

Table 8 summarizes various other properties of the films formed from the Formulation Examples F17 through F28 after RIE and ashing.

TABLE 8

Various Other Properties of Formulation Examples F17-F28

| Formulation Example No | Tack After RIE and Ashing (25° C., N/25 mm) | Tack After RIE and Ashing (25° C., N/25 mm) | Minimum Melt Viscosity (100-200° C., Pa s) | Presence of Cracks after TCT |
|---|---|---|---|---|
| F17 | 4.4 | 0.28 | 57 | Excellent |
| F18 | 5.1 | 0.42 | 76 | Good |
| F19 | 4.5 | 0.33 | 110 | Excellent |
| F20 | 4.2 | 0.26 | 105 | Excellent |
| F21 | 4.4 | 0.28 | 88 | Excellent |
| F22 | 5.6 | 0.35 | 193 | Good |
| F23 | 6.0 | 0.38 | 66 | Good |
| F24 | 3.4 | 0.21 | 278 | Good |
| F25 | 4.0 | 0.20 | 12 | Bad |
| F26 | 1.0 | 0.06 | 244 | Bad |
| F27 | 7.6 | 0.65 | 690 | Poor |
| F28 | — | — | — | — |

It is evident from the above data only the Formulation Examples F17 through F24 made in accordance with the present invention provides desirable results as summarized in Tables 7 and 8.

Figure 2:
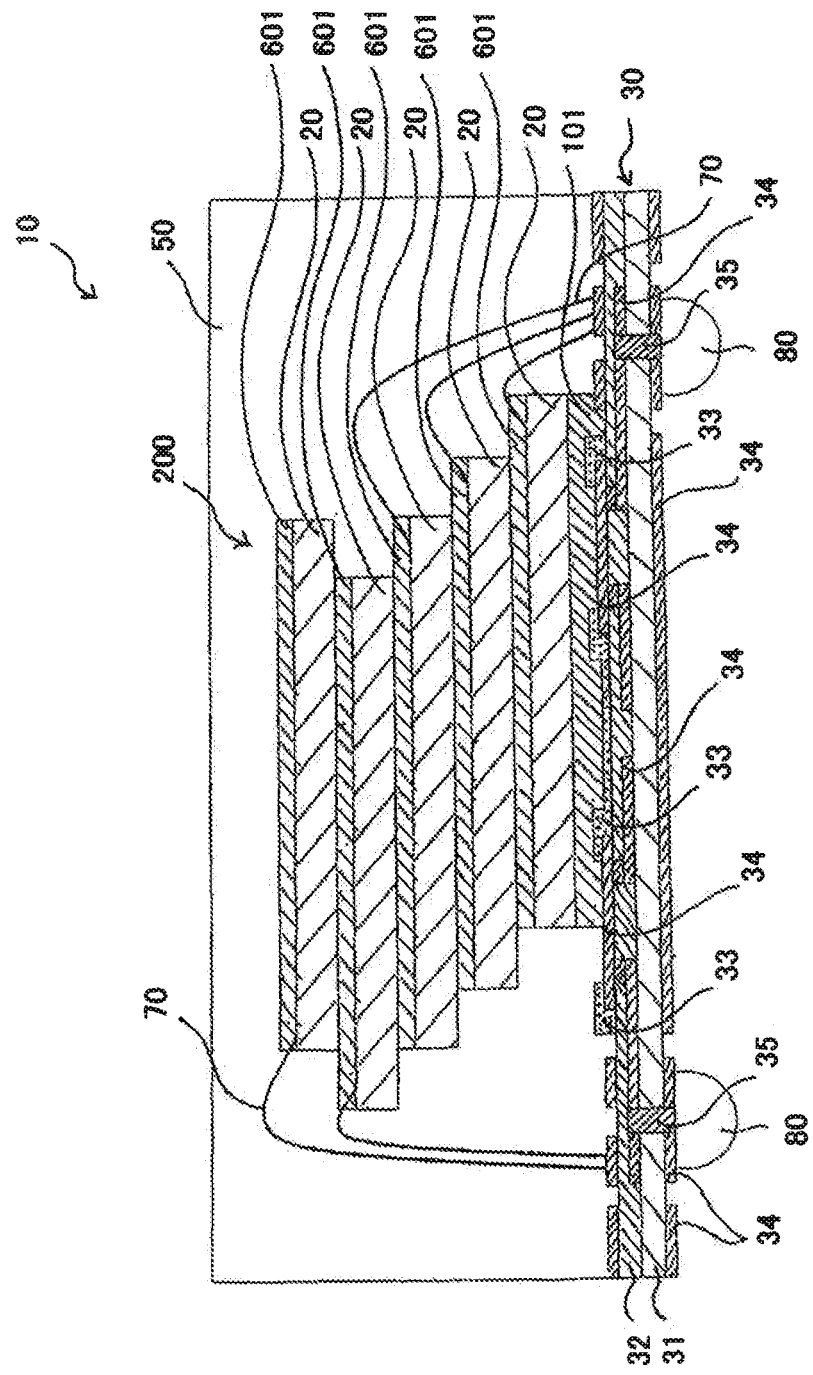
FIG. 2 is a sectional view showing an embodiment of a semiconductor device of the present invention.

Now turning to FIG. 2 a sectional view of an embodiment of a semiconductor device of the present invention is shown.

A semiconductor device 10 shown in FIG. 2 is an example having a semiconductor package in ball grid array (BGA).

The semiconductor device 10 encompasses a plurality of semiconductor chips (semiconductor elements) 20 laminated with each other, an adhesive layer 601 adhering the semiconductor chips 20 with each other, a package substrate 30 supporting the semiconductor chip 20, an adhesive layer 101 adhering the semiconductor chip 20 with the package substrate 30, a mold portion 50 sealing the semiconductor chip 20, and a solder ball 80 provided on a lower side of the package substrate 30. Each member is sequentially described in detail below.

Any kind of elements may be employed for the semiconductor chip 20, and examples thereof include a memory element such as NAND flash memory and DRAM, and an integrated circuit element such as IC and LSI.

Constituent materials of the semiconductor chip 20 are, for example, single crystal material, polycrystalline material or amorphous material of silicon, silicon carbide or the like, but not particularly limited thereto.

A plurality of semiconductor chips 20 are laminated in such a way as to shift slightly from each other in its plane direction, thereby a chips-laminated body 200 is configured. Interspaces between the semiconductor chips 20 are adhered via the adhesive layer 601.

The adhesive layer 601 is also provided on the upper surface of the chips-laminated body 200.

The package substrate 30 shown in FIG. 2 is a build-up substrate comprising a core substrate 31, an insulating layer 32, a solder resist layer 33, a wiring 34, and a conductive via 35.

Among them, the core substrate 31 is a substrate supporting the semiconductor device 10, and is made of, for example, a composite material or a glass cloth filled with a resin material.

The insulating layer 32 is an interlayer insulating layer to insulate between the wires 34 and between the wiring 34 and the conductive via 35, and is formed of, for example, a resin material. The solder resist layer 33 is a surface protective layer for protecting the wiring formed on the outermost surface of the package substrate 30, and is formed of, for example, a resin material.

The wire 34 and the conductive via 35 are transmission paths of electric signals, respectively, and are made of, for example, a metal material such as a simple substance or an alloy of Au, Ag, Cu, Al or Ni.

The solder ball 80 is electrically connected to the wiring 34, and functions as an electrode connecting the wiring 34 with another electrical circuit by being fused to an external electrical circuit.

The chips-laminated body 200 formed by laminating the plurality of semiconductor chips 20 is placed on the upper surface of the package substrate 30. The interspace between the chips-laminated body 200 and the package substrate 30 is adhered by the adhesive layer 101.

A part of the wiring 34 of the package substrate 30 is exposed on the upper surface of the package substrate 30, and this exposed portion and an electrode portion of each semiconductor chip 20 are connected by a bonding wire 70.

The mold portion 50 shown in FIG. 2 covers the side surface and the top surface of the chip-laminate 200, and is formed so as to cover the entire upper surface of the package substrate 30. Thus, it is possible to protect the chips-laminated body 200 from the external environment. For example, such mold portion 50 is made of, for example, any of the resin material, such as epoxy resin or phenol resin.

Although the invention has been illustrated by certain of the preceding examples, it is not to be construed as being limited thereby; but rather, the invention encompasses the generic area as hereinbefore disclosed. Various modifications and embodiments can be made without departing from the spirit and scope thereof.

What is claimed is:
1. A photosensitive composition comprising:
a) a polymer having a first repeating unit of formula (IA) derived from a monomer of formula (I):

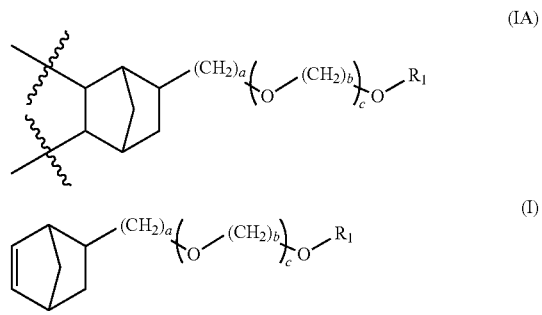

wherein:
~~~ represents a position at which the bonding takes place with another repeat unit;
a is an integer from 0 to 3;
b is an integer from 1 to 4;
c is an integer from 1 to 4;
$R_1$ is selected from hydrogen, methyl, ethyl, n-propyl, i-propyl or n-butyl;
b) a photo active compound containing a diazo-quinone moiety of formula (A):

c) an epoxy compound containing one or more oxirane groups; and
d) an additive selected from:
a compound of formula (IV):

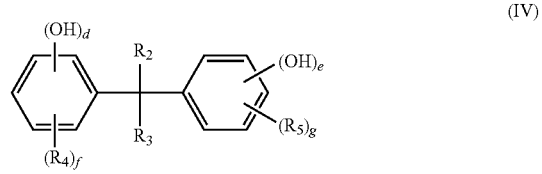

wherein d and e are integers from 1 to 4;
f and g are integers from 0 to 4;
$R_2$ and $R_3$ are the same or different and independently of each other selected from hydrogen, methyl, ethyl, linear or branched $C_3$-$C_6$alkyl, $C_3$-$C_8$cycloalkyl, $C_6$-$C_{10}$aryl or $C_7$-$C_{12}$aralkyl; or
$R_2$ and $R_3$ taken together with the carbon atom to which they are attached form a 5 to 8 membered substituted or unsubstituted carbocyclic ring where said substituents are selected from $C_1$-$C_8$alkyl;

R$_4$ and R$_5$ are the same or different and independently of each other selected from hydrogen, methyl, ethyl, linear or branched C$_3$-C$_6$alkyl, C$_3$-C$_8$cycloalkyl, C$_6$-C$_{10}$aryl or C$_7$-C$_{12}$aralkyl;

a compound of formula (V):

(V)

wherein h is an integer from 1 to 4;
i is 1 or 2;
R$_6$ independently is hydrogen, methyl, ethyl, linear or branched C$_3$-C$_{16}$alkyl, C$_3$-C$_8$cycloalkyl, C$_6$-C$_{10}$aryl or C$_7$-C$_{12}$aralkyl;

a compound of formula (VI):

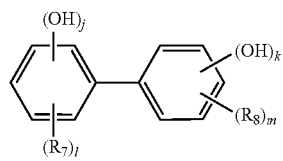

(VI)

wherein j and k are integers from 1 to 4;
l and m are integers from 0 to 4;
R$_7$ and R$_8$ are the same or different and independently of each other selected from hydrogen, methyl, ethyl, linear or branched C$_3$-C$_6$alkyl, C$_3$-C$_8$cycloalkyl, C$_6$-C$_{10}$aryl or C$_7$-C$_{12}$aralkyl;

a compound of formula (VII):

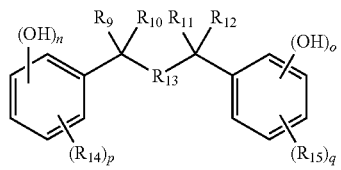

(VII)

wherein n and o are integers from 1 to 4;
p and q are integers from 0 to 4;
R$_9$, R$_{10}$, R$_{11}$ and R$_{12}$ are the same or different and independently of each other selected from hydrogen, methyl, ethyl, linear or branched C$_3$-C$_6$alkyl; or
when R$_{13}$ is —(CH$_2$)$_r$—, one of R$_9$ or R$_{10}$ and one of R$_{11}$ or R$_{12}$ taken together with the carbon atoms to which they are attached form a 5 to 8 membered substituted or unsubstituted carbocyclic ring where said substituents are selected from C$_1$-C$_6$alkyl;
R$_{13}$ is —(CH$_2$)$_r$— or phenylene, where r is 1 to 2;
R$_{14}$ and R$_{15}$ are the same or different and independently of each other selected from hydrogen, methyl, ethyl, linear or branched C$_3$-C$_6$alkyl, C$_3$-C$_8$cycloalkyl, C$_6$-C$_{10}$aryl or C$_7$-C$_{12}$aralkyl;

a compound of formula (VIII):

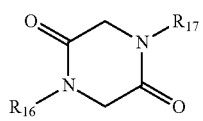

(VIII)

wherein R$_{16}$ and R$_{17}$ are the same or different and independently of each other selected from hydrogen, methyl, ethyl or linear or branched C$_3$-C$_6$alkyl;

a compound of formula (IX):

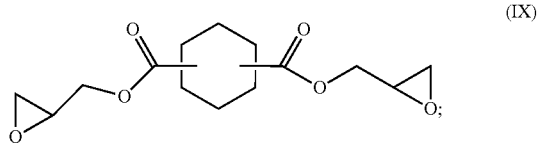

(IX)

or a compound of formula (X):

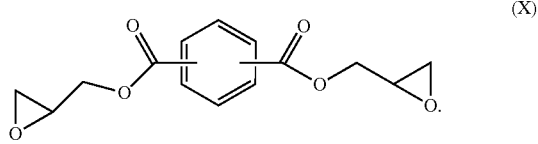

(X)

2. The photosensitive composition of claim 1 wherein the polymer further comprises a second repeating unit of formula (IIA) derived from a monomer of formula (II):

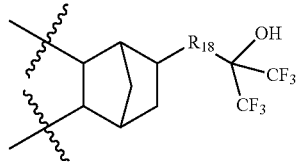

(IIA)

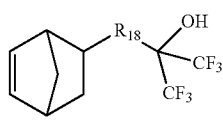

(II)

wherein ∿∿ represents a position at which the bonding takes place with another repeat unit;
R$_{18}$ is selected from —(CH$_2$)$_s$—, —(CH$_2$)$_t$—OCH$_2$— or —(CH$_2$)$_t$—(OCH$_2$CH$_2$)$_6$—OCH$_2$—, where
s is an integer from 0 to 6,
t is an integer from 0 to 4; and
u is an integer from 0 to 3.

3. The photosensitive composition of claim 2 wherein the polymer further comprises a third repeating unit of formula (IIIA) derived from a monomer of formula (III):

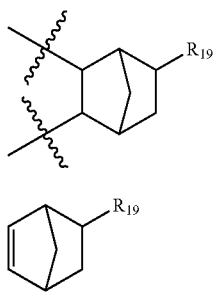

wherein ～ represents a position at which the bonding takes place with another repeat unit;

$R_{19}$ is —$(CH_2)_v$—$CO_2R_{20}$ where v is an integer from 0 to 4, and $R_{20}$ is hydrogen or $C_1$-$C_4$ alkyl.

4. The photosensitive composition of claim 3 wherein the polymer is derived from the monomers selected from the group consisting of:
norbornenyl-2-trifluoromethyl-3,3,3-trifluoropropan-2-ol (HFANB),
trioxanonanenorbornene (NBTON),
tetraoxadodecanenorbornene (NBTODD),
5-(3-methoxybutoxy)methyl-2-norbornene (NB-3-MBM),
5-(3-methoxypropanoxy)methyl-2-norbornene (NB-3-MPM),
ethyl 3-(bicyclo[2.2.1]hept-2-en-2-yl)propanoate (EPEsNB),
bicyclo[2.2.1]hept-5-ene-2-carboxylic acid (Acid NB) and norbornenylpropanoic acid (NBEtCOOH).

5. The photosensitive composition of claim 3 wherein the polymer is derived from the following monomers:
norbornenyl-2-trifluoromethyl-3,3,3-trifluoropropan-2-ol (HFANB),
3-(bicyclo[2.2.1]hept-2-en-2-yl)propanoic acid (NBEtCOOH), and
trioxanonanenorbornene (NBTON).

6. The photosensitive composition according to claim 3, which is soluble in an alkali developer.

7. A semiconductor device comprising a laminated semiconductor element where said lamination consists of a photosensitive composition according to claim 3.

8. A semiconductor device comprising a redistribution layer (RDL) structure where said RDL structure further comprises a photosensitive composition according to claim 3.

9. A semiconductor device comprising a chip stack structure where said chip stack structure further comprises a photosensitive composition according to claim 3.

10. A semiconductor device comprising a complementary metal oxide semiconductor (CMOS) image sensor dam structure where said structure further comprises a photosensitive composition according to claim 3.

11. A film comprising the composition of claim 3.

12. A microelectronic or optoelectronic device comprising one or more of a redistribution layer (RDL) structure, a chip-stack structure or a CMOS image sensor dam structure, where said structures further comprise a composition according to claim 3.

13. A method of forming a film for the fabrication of a microelectronic or optoelectronic device comprising:
coating a suitable substrate with a composition according to claim 3 to form a film;
patterning the film with a mask by exposing to a suitable radiation;
developing the film after exposure to form a photo-pattern; and
curing the film by heating to a suitable temperature.

14. The method of claim 13, where said coating is performed by spin coating.

15. The method of claim 13, where said developing is performed by an aqueous developer.

16. The method of claim 15, where said developer is aqueous tetramethylammonium hydroxide (TMAH).

17. The method of claim 13, where the substrate is first hardbaked before said curing at a temperature of from 130° C. to 160° C. for 20 minutes to 60 minutes.

18. The method of claim 13, where said curing is performed at a temperature of from 170° C. to 200° C. at an incremental heating ramp of 5° C. and for 1 to 5 hours.

19. The photosensitive composition of claim 1 wherein the diazo-quinone moiety is represented by formula (C), (D) or (E):

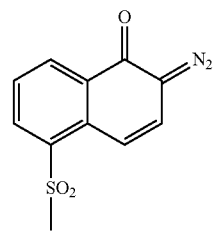

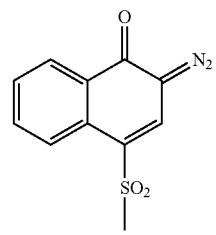

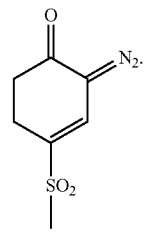

20. The photosensitive composition of claim 1 wherein the photo active compound is selected from one or more of the following:

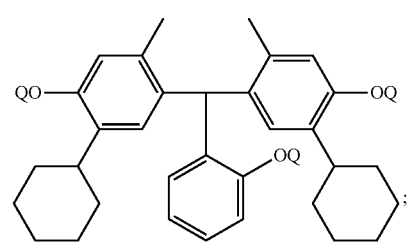

where at least one of Q is a group of the formula (C) or (D):

[Structure C: naphthoquinone diazide with SO2-methyl at 5-position]

[Structure D: naphthoquinone diazide with SO2-methyl at 4-position]

and
the remaining Q is hydrogen.

21. The photosensitive composition of claim 1 wherein the epoxy compound is selected from:

[epoxy structures]

or

22. The photosensitive composition of claim 1 wherein the additive is a compound of formula (IV) selected from:
2,2'-methylenediphenol;
4,4'-methylenediphenol;
2,2'-(ethane-1,1-diyl)diphenol;
4,4'-(ethane-1,1-diyl)diphenol;
2,2'-(propane-1,1-diyl)diphenol;
4,4'-(propane-1,1-diyl)diphenol;
2,2'-(propane-2,2-diyl)diphenol;
4,4'-(propane-2,2-diyl)diphenol;
2,2'-(4-methylpentane-2,2-diyl)diphenol;
4,4'-(4-methylpentane-2,2-diyl)diphenol;
2,2'-(5-methylheptane-3,3-diyl)diphenol;
4,4'-(5-methylheptane-3,3-diyl)diphenol;
4,4'-(propane-2,2-diyl)bis(2-cyclohexylphenol);
4,4'-(2-methylpropane-1,1-diyl)bis(2-cyclohexyl-5-methylphenol);
5,5''-(cyclohexane-1,1-diyl)bis(([1,1'-biphenyl]-2-ol));
4,4'-(cyclohexane-1,1-diyl)bis(2-cyclohexylphenol);
4,4'-(4-methylcyclohexane-1,1-diyl)diphenol;
2-cyclohexyl-4-(2-(4-hydroxyphenyl)propan-2-yl)-5-methylphenol;
6,6'-methylenebis(2-(tert-butyl)-4-methylphenol);
6,6'-(2-methylpropane-1,1-diyl)bis(2,4-dimethylphenol);

4,4'-(2-methylpropane-1,1-diyl)bis(2-(tert-butyl)-5-methylphenol);
or mixtures in any combination thereof.

23. The photosensitive composition of claim 1 wherein the additive is a compound of formula (V) selected from:
2-cyclohexylphenol;
4-cyclohexylphenol;
2-cyclohexyl-5-methylphenol;
2,4-di-sec-butylphenol;
2,6-di-tert-butyl-4-methylphenol;
2,4-di-tert-butylphenol;
4-dodecylphenol;
4-ethylresorcinol;
2-propylresorcinol;
4-butylresorcinol;
4-hexylresorcinol;
or mixtures in any combination thereof.

24. The photosensitive composition of claim 1 wherein the additive is a compound of formula (VI) selected from:
[1,1'-biphenyl]-2,2',4,4'-tetraol;
2'-methyl-[1,1'-biphenyl]-2,3,4,4'-tetraol;
[1,1'-biphenyl]-2,2',4,4',6-pentaol;
[1,1'-biphenyl]-2,2',3,4,4'-pentaol;
or mixtures in any combination thereof.

25. The photosensitive composition of claim 1 wherein the additive is a compound of formula (VII) selected from:
4,4'-(4-isopropyl-1-methylcyclohexane-1,3-diyl)diphenol;
4,4'-(1,4-phenylenebis(propane-2,2-diyl))bis(2-cyclohexyl-5-methylphenol);
4,4'-(1,3-phenylenebis(propane-2,2-diyl))bis(2-cyclohexyl-5-methylphenol);
4,4'-(1,4-phenylenebis(propane-2,2-diyl))bis(2-cyclohexylphenol);
4,4'-([1,1'-bi(cyclohexane)]-4,4'-diyl)diphenol;
4-(4-(4-hydroxyphenyl)cyclohexyl)-2-methylphenol;
or mixtures in any combination thereof.

26. The photosensitive composition of claim 1 wherein the additive is a compound of formula (VIII) selected from:
1,4-dimethylpiperazine-2,5-dione;
1-ethyl-4-methylpiperazine-2,5-dione;
1,4-diethylpiperazine-2,5-dione;
1-methyl-4-propylpiperazine-2,5-dione;
1-ethyl-4-propylpiperazine-2,5-dione;
1-ethyl-4-isopropylpiperazine-2,5-dione;
or mixtures in any combination thereof.

27. The photosensitive composition of claim 1 wherein the additive is a compound of formula (IX) selected from:
bis(oxiran-2-ylmethyl)cyclohexane-1,2-dicarboxylate;
bis(oxiran-2-ylmethyl)cyclohexane-1,3-dicarboxylate;
bis(oxiran-2-ylmethyl)cyclohexane-1,4-dicarboxylate;
or mixtures in any combination thereof.

28. The photosensitive composition of claim 1 wherein the additive is a compound of formula (X) selected from:
bis(oxiran-2-ylmethyl) phthalate;
bis(oxiran-2-ylmethyl) isophthalate;
bis(oxiran-2-ylmethyl) terephthalate;
or mixtures in any combination thereof.

29. The photosensitive composition of claim 1 further comprising one or more compounds selected from the group consisting of:

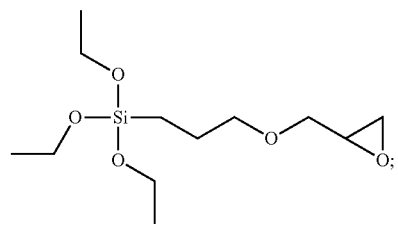

triethoxy(3-(oxiran-2-ylmethoxy)propyl)silane

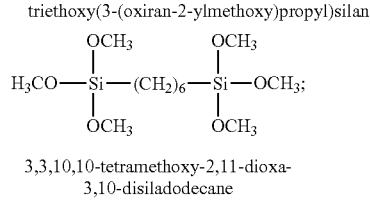

3,3,10,10-tetramethoxy-2,11-dioxa-3,10-disiladodecane

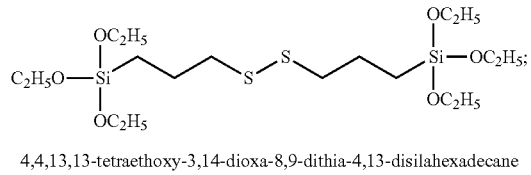

4,4,13,13-tetraethoxy-3,14-dioxa-8,9-dithia-4,13-disilahexadecane

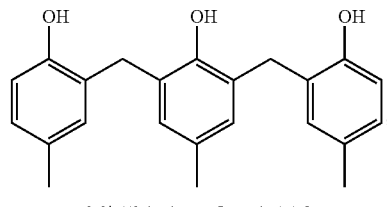

2,2'-((2-hydroxy-5-methyl-1,3-phenylene)bis(methylene))bis(4-methylphenol)

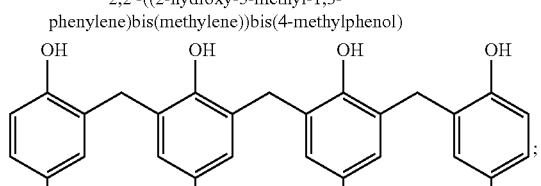

6,6'-methylenebis(2-(2-hydroxy-5-methylbenzyl)-4-methylphenol)

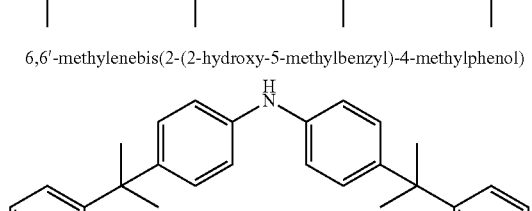

bis(4-(2-phenylpropan-2-yl)phenyl)amine

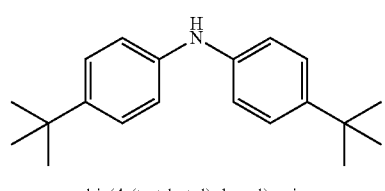

bis(4-(tert-butyl)phenyl)amine

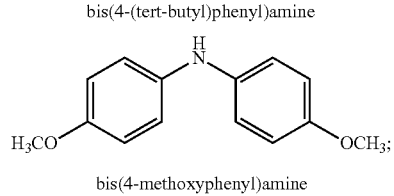

bis(4-methoxyphenyl)amine

-continued
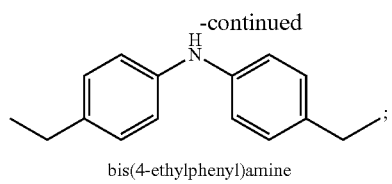
bis(4-ethylphenyl)amine
and mixtures in any combination thereof.
30. The photosensitive composition of claim 1 further comprising one or more compounds selected from the group consisting of a phenolic resin, a leveling agent, an antioxidant, a flame retardant, a plasticizer, a silane coupling agent and a curing accelerator.
* * * * *